United States Patent
Iwamuro et al.

[11] Patent Number: 5,914,503
[45] Date of Patent: Jun. 22, 1999

[54] INSULATED GATE THYRISTOR

[75] Inventors: Noriyuki Iwamuro; Yuichi Harada, both of Nagano, Japan

[73] Assignee: Fuji Electric Co., Ltd., Japan

[21] Appl. No.: 08/798,743

[22] Filed: Feb. 13, 1997

[30] Foreign Application Priority Data

Feb. 13, 1996 [JP] Japan ................................ 8-024973

[51] Int. Cl.⁶ .......................... H10L 29/74; H10L 31/111
[52] U.S. Cl. ........................ 257/133; 257/134; 257/138; 257/330; 257/135
[58] Field of Search ................................ 257/133–136, 257/139, 137, 138, 329, 330

[56] References Cited

U.S. PATENT DOCUMENTS

| 4,502,070 | 2/1985 | Leipold et al. ........................ 257/138 |
| 5,378,914 | 1/1995 | Ohzu et al. ............................ 257/330 |
| 5,554,862 | 9/1996 | Omura et al. .......................... 257/137 |
| 5,719,411 | 2/1998 | Ajit ........................................ 257/133 |

FOREIGN PATENT DOCUMENTS

| 409-010 | 1/1991 | European Pat. Off. ............... 257/133 |
| 0 736 909A2 | 9/1996 | European Pat. Off. . |
| 736-909-A2 | 10/1996 | European Pat. Off. . |
| 406061479 | 3/1994 | Japan ..................................... 257/133 |

*Primary Examiner*—Peter Toby Brown
*Assistant Examiner*—Hung Van Duong
*Attorney, Agent, or Firm*—Rossi & Associates

[57] ABSTRACT

An insulated gate thyristor is provided in which an inversion layer is created beneath a gate electrode to which a voltage is applied. An emitter region of a first conductivity type is biased to the same potential as a first main electrode via a MOSFET channel, and a thyristor portion consisting of the emitter region, a second base region of a second conductivity type, a base layer of the first conductivity type and an emitter layer of the second conductivity type is turned on. As electrons are injected uniformly from the entire emitter region, the insulated gate thyristor quickly shifts to the thyristor mode, and the on-voltage of the insulated gate thyristor of the invention is lowered. The insulated gate thyristor of the invention does not require a hole current that flows through the second base region of a convention EST in the Z-direction. In turning off, the pn junction recovers quickly without causing current localization, and the breakdown withstand capability if improved.

40 Claims, 27 Drawing Sheets

INSULATED GATE THYRISTOR

FIELD OF THE INVENTION

The present invention relates to an insulated gate thyristor used as a power switching device.

BACKGROUND OF THE INVENTION

The thyristors is an indispensable device for high power use due to its low on-voltage. In these days, many gate turnoff (GTO) thyristors are used in the high-voltage high-current region. However, some demerits of the GTO thyristor have also become tangible; a large gate current is necessary for turning off the GTO thyristor, i.e. the turnoff gain is small, and a large snubber circuit is necessary for safe turnoff of the GTO thyristor. Since the GTO thyristor does not exhibit current saturation in its current/voltage characteristics, it is necessary to connect a fuse and such passive parts for load short-circuit protection. This is very hazardous for down-sizing of the system and for cost reduction. V. A. K. Temple disclosed a MOS controlled thyristor (MCT), classified into a voltage-driven-type thyristor, in IEEE IEDM Tech. Dig. (1984), p282. Since then, analyses and improvements of the MCT have been conducted in various laboratories, world wide. Since the MCT is of voltage-driven-type, the MCT uses a much simpler gate circuit than that for GTO thyristors and exhibits lower on-voltage than those of the GTO thyristors. However, the MCT also requires a fuse and such passive parts in practical use, since the MCT does not exhibits current saturation in the current/voltage characteristics as the GTO thyristor. M. S. Shekar et al. revealed experimentally in IEEE Electron Device Lett. Vol. 12 (1991), p287 that a dual-channel-type emitter switched thyristor (EST-1) exhibits current saturation up to a high voltage region. The inventors of the present invention disclosed in Proc. IEEE ISPSD, '93, p71 and Proc. IEEE ISPSD, '94, p195 the analytical results of the EST in the forward bias safe operation area (FBSOA) and the reverse bias safe operation area (RBSOA), and opened up for the first time a way for developing a device which still has a safe operation area even when a load short circuit is caused. FIG. 41 shows the device structure of this EST device.

Referring now to FIG. 41, the device includes a p-type emitter layer 1, an n-type buffer layer 2 on p-type emitter layer 1, and an n-type base layer 3 on n-type buffer layer 2. A first p-type base region 4, a p$^+$ base region 5 which occupies a part of p-type base region 4 and has a deeper diffusion depth than p-type base region 4, and a second p-type base region 6 are in the surface portion of n-type base layer 3. An n-type source region 7 is in the surface portion of the first p-type base region 4, and an n-type emitter region 8 in the surface portion of the second p-type base region 6. A gate electrode 10 is disposed via a gate insulation film 9 on the device from the portion of p-type base regions 4 extending between n-type source region 7 and the extended portion of n-type base layer 3 between the first and second p-type base regions 4 and 6 to the portion of p-type base region 6 extending between n-type emitter region 8 and the extended portion of n-type base layer 3. These constituents are finite in length in Z-direction of the figure. The first and second p-type base regions 4 and 6 are connected with each other at their far ends of the figure. An L-shaped p$^+$ base region 5 is formed outside the first and second p-type base regions 4 and 6. A cathode 11 contacts commonly with the surfaces of p$^+$ base region 5 and n-type source region 7. An anode 12 is disposed on the entire back surface of p-type emitter layer 1.

An inversion layer (partial storage layer) is created below gate insulation film 9 and a lateral MOSFET is turned on by applying a positive voltage to gate electrode 10 under the state that cathode 11 is grounded and a positive voltage is applied to anode 12. At first, electrons flow from cathode 11 to n-type base layer 3 via n-type source region 7 and the channel in the surface portion of p-type base regions 4. The electrons work as a base current of a pnp transistor consisting of p-type emitter layer 1; n-type buffer layer 2 and n-type base layer 3; and p-type base region 4, p-type base region 6 and p$^+$ base region 5, and the pnp transistor operates. Holes are injected from p-type emitter layer 1. A part of the injected holes flows to p-type base region 6 via n-type buffer layer 2 and n-type base layer 3. Then, the holes flow below n-type emitter region 8 in Z-direction to cathode 11 putting the device in the IGBT mode. As the current further increases, the pn junction between n-type emitter region 8 and p-type base region 6 is biased forward and the thyristor portion consisting of p-type emitter layer 1; n-type buffer layer 2 and n-type base layer 3; and p-type base region 6 and n-type emitter region 8 is latched up. In turning off the EST, the potential of gate electrode 10 is lowered below the threshold voltage of the lateral MOSFET to turn off the lateral MOSFET. As a result, the potential of n-type emitter region 8 is disconnected from that of cathode 11, and the thyristor stops operating.

FIGS. 42 and 43 show the improved EST's disclosed by M. S. Shekar et al. in the U.S. Pat. No. 5,317,171 and U.S. Pat. No. 5,319,222. The improved EST of FIG. 43 is different from the EST of FIG. 41 in that the EST of FIG. 43 aims at a lower on-voltage.

FIG. 44 shows a FET controlled thyristor disclosed by Leipold et al. in the U.S. Pat. No. 4,502,070.

Since the EST of FIG. 41 biases forward the pn junction between the second p-type base region 6 and n-type emitter region 8 by utilizing the holes which flow in the second p-type base region 6 in Z-direction as explained above, the degree of forward bias is smaller as nearer to the contact portion of cathode 11 and p-type base region 6. To say in other wards, in the pn junction, the injection amount of electrons from n-type emitter region 8 varies along Z-direction. When the EST is turned off under such an on-state, the junction recovers naturally from the shallowly biased contact portion with cathode 11 and delays recovering in the portion far from the contact portion with cathode 11. This causes current localization in turning-off and lowers the breakdown withstand capability at turning-off.

Though the operation principle of the device of FIG. 42 is not different from that of the EST of FIG. 41, the device of FIG. 42 facilitates quick turning-off, since a cathode 11 extends in Y-direction and contact directly with the surface of the second p-type base region 6. The device of FIG. 42 also facilitates quick turning-on, since the device of FIG. 42 does not utilize the hole current in Z-direction. However, the on-voltage does not lower so much as expected, since uneven minority carrier injection is caused in the horizontal direction Y-direction) even when the pn junction between an n-type emitter region 8 and a p-type base region 6 turns on. If the resistance of p-type base region 6 is increased to solve the foregoing problem, e.g., by lowering the impurity concentration in p-type base region 6, a depletion layer will punch through n-type emitter region 8 when a forward blocking voltage is applied and a sufficiently high breakdown voltage will not be obtained.

In the device of FIG. 43, an n-type emitter region 8 is extended outside a p-type base region 6 to further lower the on-voltage. However, this structure can not provide the device with a sufficient forward blocking voltage.

The device of FIG. 44 solves the above described problem by separating an n-type emitter region 8 and p-type base region 6 completely from a cathode 11. However, a depletion layer does not expand from p-type base region 6 when a forward bias voltage is applied, since the electrical potentials of n-type emitter region 8 and p-type base region 6 are floating. Therefore, the breakdown voltage characteristics of the device of FIG. 44 are inferior to those of the improved EST's.

In view of the foregoing, it is an object of the present invention to provide an insulated gate thyristor having a structure which facilitates uniform recovery of the pn junction at turning-off. It is another object of the invention to provide an insulated gate thyristor which exhibits large turnoff withstand capability, small on-voltage and excellent breakdown voltage characteristics.

SUMMARY OF THE INVENTION

According to an aspect of the present invention, there is provided an insulated gate thyristor which includes: a highly resistive base layer of a first conductivity type; a first base region of a second conductivity type, the first base region being selectively formed in the surface portion on a first side of the base layer; a second base region of the second conductivity type, the second base region being selectively formed in the surface portion on the first side of the base layer; the first and second base regions being spaced from each other; a source region of the first conductivity type, the source region being selectively formed in the surface portion of the first base region; an emitter region of the first conductivity type, the emitter region being selectively formed in the surface portion of the second base region; a first insulation film on the extended portion of the base layer extended between the first and second base regions, the extended portion of the first base region extended between the source region and the extended portion of the base layer and the extended portion of the second base region extended between the emitter region and the extended portion of the base layer; a gate electrode on the first insulation film; a first main electrode commonly contacting with the extended portion of the first base region and the source region; an emitter layer of the second conductivity type, the emitter layer being on a second side of the base layer; a second main electrode contacting with the emitter layer; a second insulation film covering the entire surface of the second base region; and a resistor on the emitter region, the resistor being connected to the first main electrode.

According to another aspect of the invention, there is provided an insulated gate thyristor which includes: a highly resistive base layer of a first conductivity type; a first base region of a second conductivity type, the first base region being selectively formed in the surface portion on a first side of the base layer; a second base region of the second conductivity type, the second base region being selectively formed in the surface portion on the first side of the base layer; the first and second base regions being spaced from each other; a source region of the first conductivity type, the source region being selectively formed in the surface portion of the first base region; an emitter region of the first conductivity type, the emitter region being in the surface portion of the second base region; a trench between the first and second base regions, the trench being dug more deeply than the first and second base regions; an insulation film covering the inner surface of the trench; a gate electrode in the trench with the insulation film interposed between the gate electrode and the trench; a first main electrode commonly contacting with the extended portion of the first base region and the source region, the extended portion being extended beside the source region; an emitter layer of the second conductivity type, the emitter layer being on a second side of the base layer; a second main electrode contacting with the emitter layer; and a resistor on the emitter region, the resistor being connected to the first main electrode.

In the thus constructed insulated gate thyristor of the invention, when an inversion layer is created beneath the gate electrode to which a voltage is applied, the emitter region of the first conductivity type is biased to the same potential with the first main electrode via the channel of the MOSFET, and the thyristor portion consisting the emitter region of the first conductivity type, the second base region of the second conductivity type, the base layer of the first conductivity type and the emitter layer of the second conductivity type is turned on. Since electrons are injected uniformly from the entire emitter region in this occasion, the insulated gate thyristor quickly shifts to the thyristor mode, and the on-voltage of the insulated gate thyristor of the invention is lowered. The insulated gate thyristor of the invention does not require such a hole current that flows through the second base region of the second conductivity type of the conventional EST in Z-direction. In turning-off, the pn junction recovers quickly without causing current localization, and the breakdown withstand capability is improved.

Moreover, since the emitter region is kept at the same potential with the first main electrode, the carriers are swept out quickly in the turnoff.

By adopting the trench gate structure, the channel region can be formed along the side face of the trench and the cell pitch is greatly reduced.

Advantageously, the first and second base regions are shaped with stripes facing opposite to each other. Or, the at least one of the first base region, second base region, source region or emitter region is shaped with a polygon, circle or ellipsoid.

By shaping the constituent regions as described above, the semiconductor substrate is utilized efficiently, the current is distributed uniformly, and the heat valance is improved.

Advantageously, the first base region and the source region in the surface portion of the first base region surround the second base region. Or, a plurality of the first base region having the source region in the surface portion thereof is arranged around the second base region.

By the above described arrangements, the current flowing from the emitter region to the source region via the channel region is distributed and the current localization is avoided.

Advantageously, the first base region is around the second base region, the gate electrode is annular around the second insulation film on the second base region, and the first main electrode is spaced from the second base region by the gate electrode and the second insulation film.

By the above described arrangements, the storage layer is formed in the surface portion of the semiconductor layer of the first conductivity type below the gate electrode, and the on-voltage is lowered.

Advantageously, the base regions of the second conductivity type in which the source region is not formed are added to the insulated gate thyristor.

Since the base regions which lack the source region work as a hole for extracting the carriers, the latch-up withstand capability of the parasitic thyristor and the controllable current of the insulated gate thyristor are increased.

By narrowing the gate electrode on the base regions, in which the source region is not formed, from the gate electrode width on the first base regions, in which the source region is formed, the base regions in which the source region is not formed work as the hole for extracting the carriers more effectively.

Advantageously, the contact portion of the first main electrode with the first base region and the source region is shaped with a polygon, circle and ellipsoid.

By the arrangements as described above, the semiconductor substrate is utilized efficiently, the current is distributed uniformly, and the heat valance is improved.

Advantageously, the annular gate electrode comprises a cut-out portion, through which adjacent pair of the first base region, adjacent source regions in an adjacent pair of the first base region and adjacent first main electrodes on the adjacent pair of the first base region are connected respectively to each other.

By the above described configuration, the first base region and the source region are widened and the on-voltage is lowered.

Advantageously, the portion of the source region's surface facing opposite to the second base region is covered with the second insulation film, and the first main electrode contacts with the portion of the source region's surface far from the second base region.

By the above described configuration, the latch-up withstand capability of the parasitic thyristor and the controllable current of the insulated gate thyristor are increased, since the current which flows from the emitter region to the source region via the channel region beneath the gate electrode does not flows the portion near the emitter region.

Advantageously, at least a portion of the source region below the edge of the gate electrode is divided into a plurality of regions.

By adopting the above described structure, the base regions which lack the source region work as a hole for extracting the carriers, and the latch-up withstand capability of the parasitic thyristor is increased.

Advantageously, the gate electrode is wider between two source regions than between the source region and the emitter region.

By changing the gate electrode width from spot to spot, the channel resistance at turning-on is reduced without increasing the resistance by the junction FET effect at an early stage of the turning-on.

An auxiliary region of the first conductivity type, doped more heavily than the base layer is formed in the surface portion of the base layer beneath the first insulation film.

The auxiliary region facilitates reducing the channel resistance at turning-off, promoting the current distribution at turnoff and preventing the current from localizing.

Advantageously, the second base region is diffused more deeply than the first base region, and the emitter region is diffused more deeply than the source region.

By the diffusions described above, the current amplification factor of the npn transistor in the thyristor portion is increased and the on-voltage of the insulated gate thyristor is lowered.

Advantageously, the lifetime killers are localized.

By optimizing the distribution of the lifetime killers, adverse effects such as on-voltage rise is avoided, since the lifetime killer seldom exist in the unwanted portions of the insulated gate thyristor.

Advantageously, a buffer layer of the first conductivity type, doped more heavily than the base layer, is additionally disposed between the base layer and the emitter layer.

The disposition of the buffer layer facilitates expanding the depletion layer into the entire base layer and provides the structure suitable to a high voltage device.

Advantageously, a heavily doped thin layer of the second conductivity type is disposed in the surface portion of the emitter layer to lower the contact resistance of the second main electrode.

According to still another aspect of the invention, there is provided a method of manufacturing the insulated gate thyristor, which method includes the step of forming the heavily doped thin layer of the second conductivity type in the surface portion of the emitter layer by helium ion implantation.

An extremely thin heavily doped layer is easily formed by ion implantation in the surface portion of the semiconductor layer.

BRIEF DESCRIPTION OF THE DRAWINGS

FIG. 10($b$) is a horizontal cross section including a center of a gate electrode of the insulated gate thyristor of the fifth embodiment.

DETAILED DESCRIPTION OF THE PREFERRED EMBODIMENTS

During the investigation of various experimental insulated gate thyristors developed from the EST, the present inventors have found that it is not necessary to make contact the first main electrode and the second base region of the second conductivity type. It has been also found that the insulated gate thyristor, which includes an insulation film covering the surface of the second base region of the second conductivity type, and a resistor disposed on the surface of the emitter region of the first conductivity type and connected to the first main electrode, shifts to the thyristor mode and exhibits an excellent tradeoff characteristics between on-voltage and turnoff time. Moreover, the present inventors have investigated various planar device patterns.

The results are as follows. The first and second base regions of the second conductivity type may be shaped with stripes facing to each other, a polygon, circle or ellipsoid. Especially when the first base region is arranged around the second base region, the current localization is prevented from causing and the tradeoff characteristics are improved. It is preferable to arrange a plurality of the first base region around the second base region. It is also preferable to adopt a trench gate structure which buries a gate electrode in a trench.

The current localization is prevented by changing the with of the gate electrode from spot to spot, by selectively forming a heavily doped region in the surface portion of the base layer of the first conductivity type, by dividing the source region of the first conductivity type under the edge of the gate electrode into a plurality of regions, by covering the surface of the source region near the second base region with an insulation film or by disposing the other base region of the second conductivity in which the source region of the first conductivity type is not formed.

The on-voltage is lowered by diffusing the first base region and second base region to the different depths and by diffusing the source region and emitter region to the different depths. The on-voltage is also lowered effectively by localizing the lifetime killers.

Figure 41:
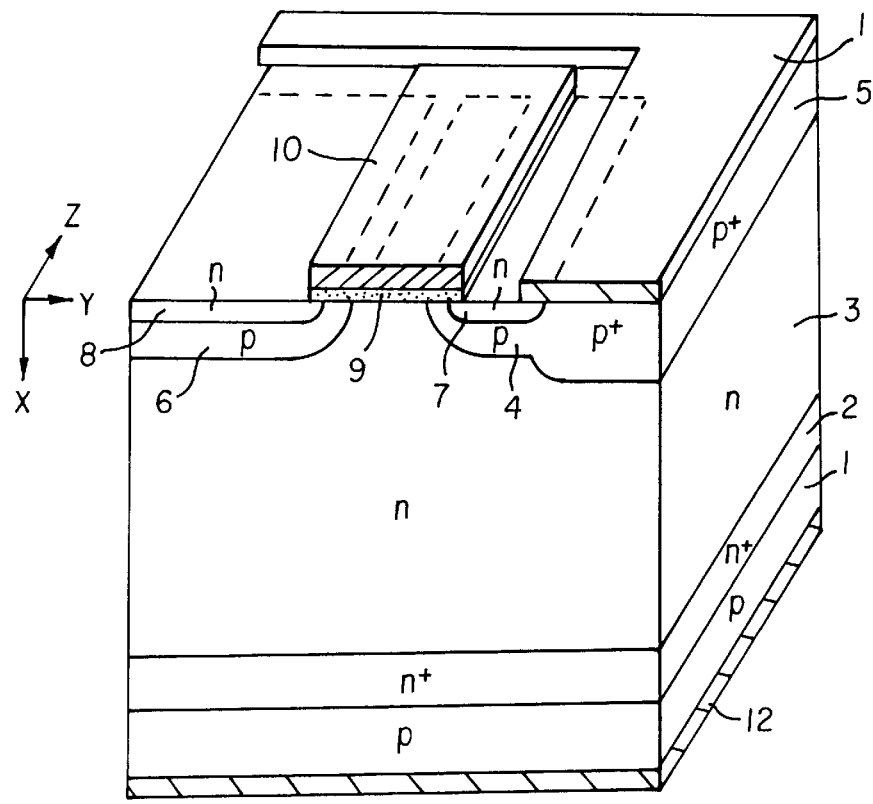
FIG. 41 is a sectional perspective view of an EST.

Now, the present invention will be explained hereinafter with reference to the accompanied drawing figures which illustrate the preferred embodiments of the invention. Throughout these figures, the like parts with those of FIG. 41 are designated by the like reference numerals. In the following embodiments, the regions and layers having the prefix "n" or "p" are the regions and layers, the majority carrier thereof is the electron or hole. Though the first conductivity type is n-type and the second conductivity type is p-type in the following explanation, the conductivity types are interchangeable to each other.

First Embodiment

Figure 1:
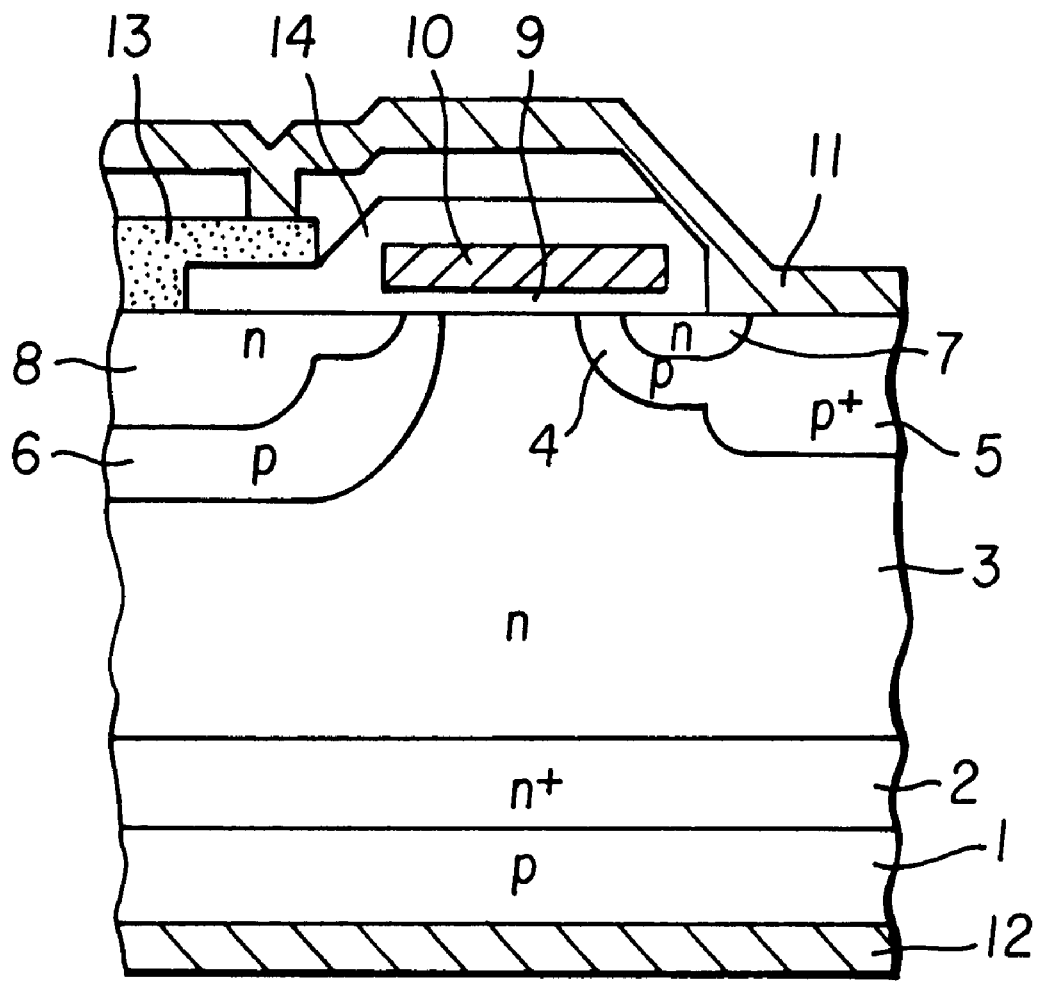
FIG. 1 is a cross section of a part of an insulated gate thyristor of a first embodiment according to the invention.

FIG. 1 is a cross section of a part of an insulated gate thyristor of a first embodiment according to the invention. This cross section illustrate a unit cell. The semiconductor device includes many unit cells with their horizontal arrangements inverted alternately and repeated. Referring now to FIG. 1, the structure of the substrate portion of the insulated gate thyristor resembles that of the EST of FIG. 41. A first p-type base region 4 and a second p-type base region 6, separated from each other, are formed in the surface portion of a highly resistive n-type base layer 3. A p-type well region 5 is diffused through a part of p-type base region 4 and more deeply than p-type base region 4 to prevent a parasitic thyristor from latching up. An n$^+$ buffer layer 2 is on the second surface of n-type base layer 3, and a p-type emitter layer 1 is on n$^+$ buffer layer 2. An n-type source layer 7 is selectively formed in the surface portion of the first p-type base region 4 and an n-type emitter region 8 in the surface portion of the second p-type base region 6. An n-channel lateral MOSFET is constructed, in the same manner as in FIG. 41, by disposing a gate electrode 10 via a gate oxide film 9 on a first surface of the device from the portion of p-type base regions 4 extending between n-type source region 7 and the extended portion of n-type base layer 3 between the first and second p-type base regions 4 and 6 to the portion of p-type base region 6 extending between n-type emitter region 8 and the extended portion of n-type base layer 3. The first surface of the device is covered with an insulation film 14 of such as phosphor glass and such insulators. A contact hole is bored such that a cathode 11 contacts commonly with the surfaces of the first p-type base regions 4 and n-type source region 7. A window is opened through the insulation film on n-type emitter region 8, to which a resistor of a polycrystalline silicon film 13 contacts through the window. Polycrystalline silicon film 13 contacts with cathode 11 through the window opened through insulation film 14. The resistance of polycrystalline silicon film 13 may be adjusted by adjusting the distance between the contact points of polycrystalline silicon film 13 with n-type emitter region 8 and cathode 11.

The insulated gate thyristor of FIG. 1 may be manufactured through the process almost similar with that of the conventional IGBT simply be changing the masks for forming the diffusion regions. For a 600 V-class device, for example, an epitaxial wafer, consisting of a p-type silicon substrate with resistivity of 0.02 Ω.cm and thickness of 450 nm, an n-layer with resistivity of 0.1 Ω.cm and thickness of 10 μm epitaxially grown for n$^+$ buffer layer 2 on the p-type silicon substrate, and an n-layer with resistivity of 40 Ω.cm and thickness of 55 μm epitaxially grown for n-type base layer 3 on buffer layer 2, was used. P-type base regions 4, 6 and p-type emitter layer 1 were formed by boron ion implantation and by subsequent thermal diffusion. N-type emitter region 8 and n-type source region 7 were formed by implanting arsenic ions and phosphorous ions and by subsequent thermal diffusion. P-type base regions 4, 6, n-type source region 7 and n-type emitter region 8 were positioned with their edges aligned by polycrystalline silicon gate electrode 10 and with spacing between them determined by their lateral diffusion. Cathode 11 was deposited by sputtering an aluminum alloy. Anode 12 is formed by laminating three layers of Ti, Ni and Au by sputtering to facilitate soldering to a metal base plate. To shorten the switching time, the carrier lifetime was controlled by proton irradiation. The proton irradiation localizes the crystal defects which work as the lifetime killer. Protons were irradiated under an acceleration voltage of 10 MeV with dose amount of from $1 \times 10^{11}$ to $1 \times 10^{12}$ cm$^{-2}$. Then, annealing was conducted at from 350 to 375° C.

The first p-type base region 4 was diffused as deep as 3 μm, the second p-type base region 6 as deep as 18 μm, n-type emitter region 8 as deep as 10 μm, and n-type source region 7 as deep as 0.4 μm. Gate electrode 10 was 25 μm in width and n-type source region 7 was 4 μm in width. The cell pitch was 55 μm. These dimensions increase the current amplification factor of the npn transistor in the thyristor portion and lower the on-voltage. The portion of n-type emitter region 8 near the first base region 4 was formed to have almost the same dimensions as n-type source region 7 considering the breakdown voltage.

Figure 2:
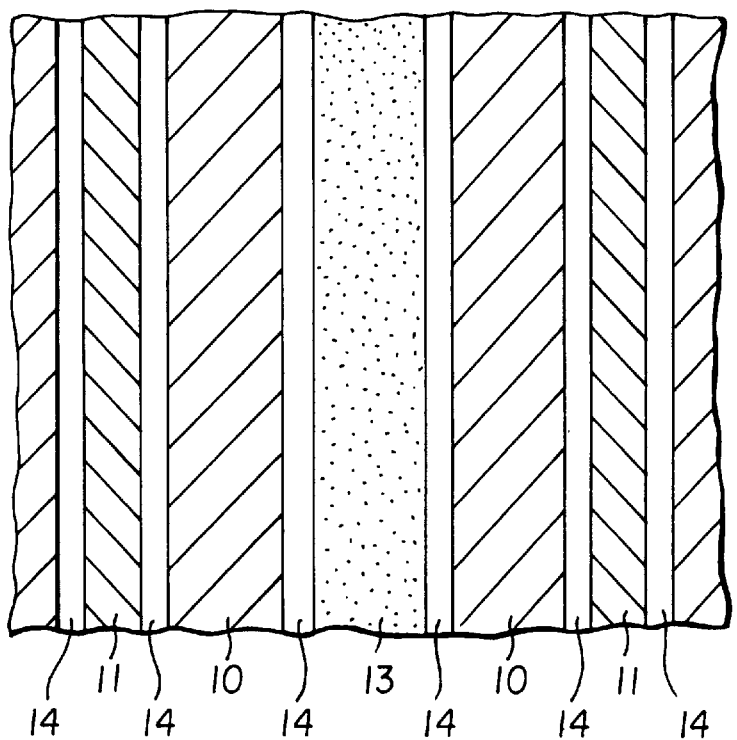
FIG. 2 is a horizontal cross section including the center of the gate electrode of the MOSFET which includes a plurality of the cell of FIG. 1.

FIG. 2 is a horizontal cross section including the center of the gate electrode 10 of the MOSFET which includes a plurality of the cell of FIG. 1. In FIG. 2, the like parts as those of FIG. 1 are designated by the like reference numerals. Cathodes 11, gate electrodes 10, polycrystalline silicon films 13 and insulation films 14 separating these constituents are arranged in stripe. Though cathode 11 is shaped with a stripe in FIG. 2, cathode 11 is often extended, in practice, over gate electrode 10 via insulation film 14 as illustrated in the cross section of FIG. 1.

The insulated gate thyristor formed as described above works in the following manner. By applying a positive voltage exceeding a certain value (threshold value) to gate electrode 10 under the state that cathode 11 is grounded and a positive voltage is applied to anode 12, an inversion layer (partial storage layer) is created under gate oxide film 9 and the foregoing lateral MOSFET is turned on. As the lateral MOSFET is turned on, electrons are supplied at first from cathode 11 to n-type base layer 3 via n-type source region 7 and the channel of the MOSFET. The electrons work as a base current of a pnp transistor consisting of p-type emitter layer 1, n$^+$ buffer layer 2 and n-type base layer 3, and p-type base region 4 (p$^+$ well region 5) to operate the pnp transistor. This operation is called an "IGBT mode". Holes are injected from p-type emitter layer 1 and flows to the first p-type base region 4 via n$^+$ buffer layer 2 and n-type base layer 3. Since the second p-type base region 6 is floating, the potential of p-type base region 6 is raised gradually by the hole current flowing through n-type base layer 3. Since n-type emitter region 8 is kept at the same potential with cathode 11 via polycrystalline silicon film 13, electron injection from n-type emitter region 8 starts in a short time, and a thyristor portion consisting of p-type emitter layer 1, n$^+$ buffer layer 2 and n-type base layer 3, the second p-type base region 6, and n-type emitter region 8 works. This operation is called a "thyristor mode".

In turning-off of the thyristor, by turning off the lateral MOSFET by lowering the potential of gate electrode 10 below the threshold value of the lateral MOSFET, n-type emitter region 8 is electrically disconnected from cathode 11 and the thyristor portion stops working.

The insulated gate thyristor of FIG. 1 is different from the EST of FIG. 41 in that polycrystalline silicon film 13, connected to cathode 11, contacts with the surface of n-type emitter region 8.

Therefore, n-type emitter region 8 is kept at almost the same potential via polycrystalline silicon film 13 with that of cathode 11. Due to this potential scheme, the potential of the second p-type base region 6 is raised gradually by the hole current flowing through the n-type base layer 3. Finally, electron injection from n-type emitter region 8 starts to turn on the thyristor consisting of n-type emitter region 8, p-type base region 6, n-type base layer 3 and p-type emitter layer 1. Therefore, the insulated gate thyristor of FIG. 1 facilitates quickly shifting from the IGBT mode to the thyristor mode, since the insulated gate thyristor of FIG. 1 does not require such a hole current which flows in the second p-type base region of the EST in Z-direction of FIG. 41. And, the on-voltage of the insulated gate thyristor of FIG. 1 is low, since the electrons are injected uniformly from entire n-type emitter region 8. Since the pn junction between n-type emitter region 8 and p-type base region 6 recovers uniformly by the potential difference in turning-off, the current localization is avoided and the RBSOA of the insulated gate thyristor of FIG. 1 is drastically widened. Since n-type emitter region 8 contacts with cathode 13 via polycrystalline silicon film 13, a depletion layer expands quickly from the second p-type base region 6 at turning-off, the insulated gate thyristor of FIG. 1 exhibits excellent breakdown voltage characteristics. The insulated gate thyristor of FIG. 1 exhibits excellent switching characteristics, since the carriers are swept out more quickly.

Figure 4:
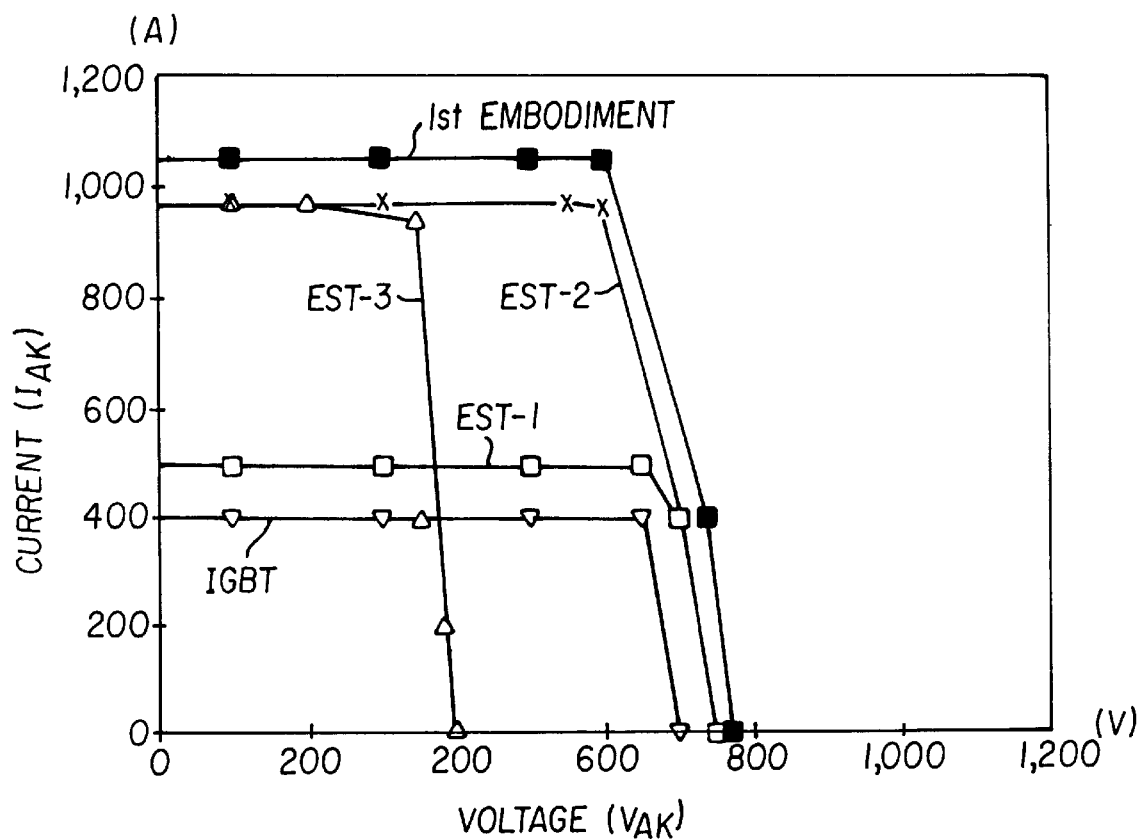
FIG. 4 is a set of curves comparing the reverse bias safe operation areas (RBSOA's) of the insulated gate thyristor of FIG. 1 and the comparative devices of 600 V-class.
Figure 42:
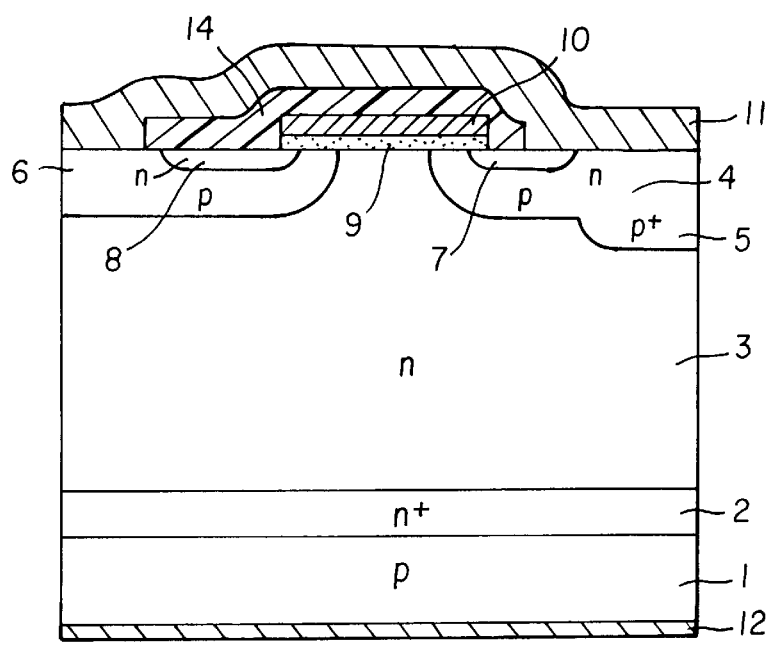
FIG. 42 is a cross section of an improved EST.
Figure 43:
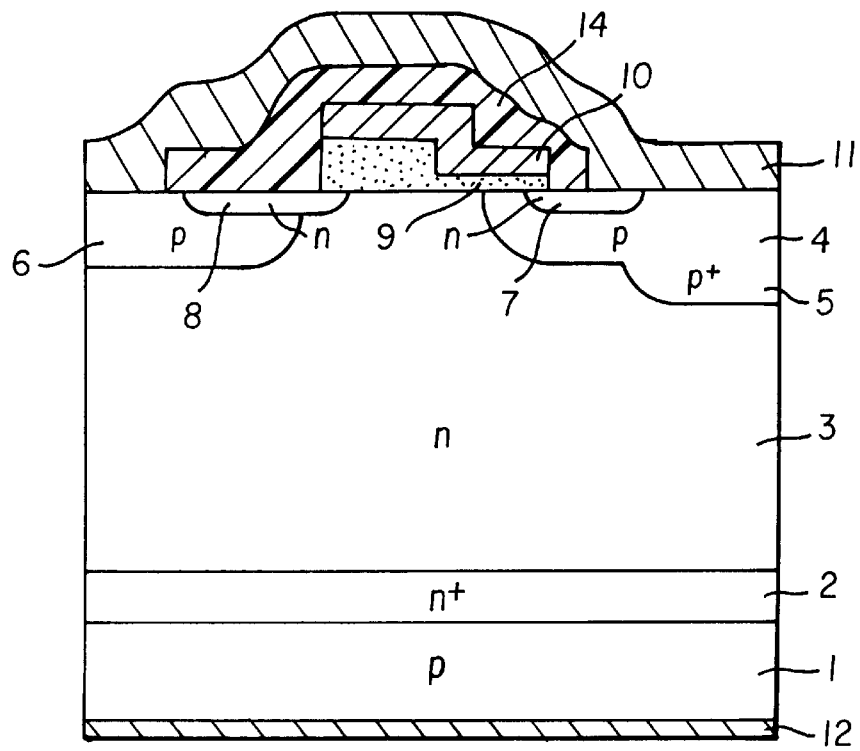
FIG. 43 is a cross section of another improved EST.
Figure 44:
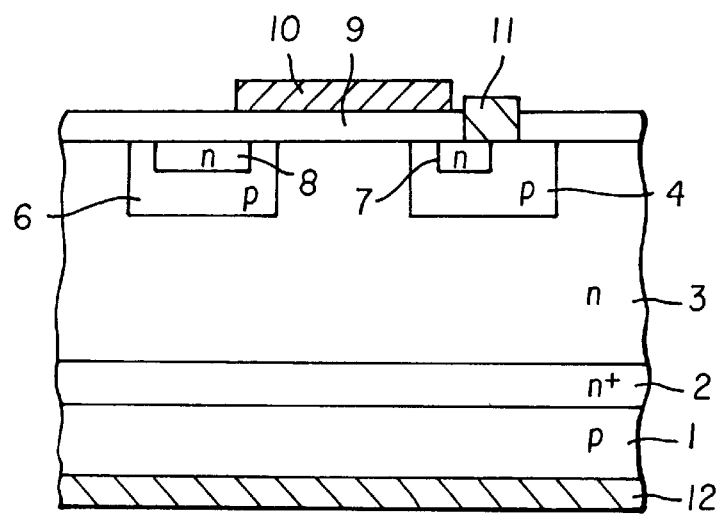
FIG. 44 is a cross section of and FET controlled thyristor.

FIG. 4 is a set of curves comparing the reverse bias safe operation areas (RBSOA's) of the insulated gate thyristor of FIG. 1, the EST of FIG. 41 (denoted as EST-1), the EST of FIG. 42 (denoted as EST-2), the EST of FIG. 43 (denoted as EST-3), and the IGBT. The RBSOA's were measured at 125° C. by the circuit of FIG. 5. In FIG. 4, the axis of abscissas represents the voltage between the anode and cathode ($V_{AK}$), and the axis of ordinates the current between the anode and cathode ($I_{AK}$).

Figure 5:
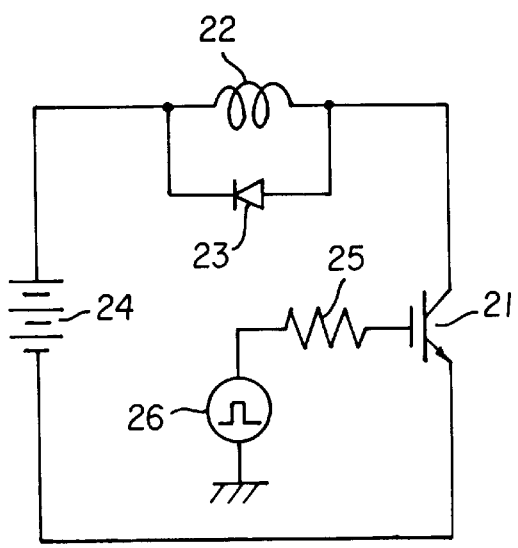
FIG. 5 is a circuit diagram for measuring the RBSOA.

Referring now to FIG. 5, a device 21 to be measured is connected to a DC power supply 24 via a parallel circuit of an inductance 22 of 1 mH and a freewheeling diode 23. The device 21 is connected also to a gate power supply 26 via a resistor 25 of 20 Ω.

The measured devices of FIG. 4 were 600 V-class devices. Each of the comparative devices was fabricated by using an epitaxial wafer of the same specifications with that for the insulated gate thyristor of the first embodiment. The width of n-type emitter region 8 was 20 μm for the EST-2 and EST-3. The chip area was 1 cm² for all the devices. The on-voltage defined by the potential drop when a current of 100 A is made flow was 0.9 V for the insulated gate thyristor of the first embodiment, 1.6 V for the EST-1, 1.7 V for the EST-2, 1.0 V for the EST-3, and 2.3 V for the IGBT. As can be seen from FIG. 4, the device of the first embodiment has a safe operation area 2.5 times as wide as that of the IGBT and twice as wide as those of the EST-1 and EST-3. That is, the device of the invention exhibits a great breakdown withstand capability. Moreover, the on-voltage of the device of the first embodiment is lower than that of the other comparative devices. In comparison with the EST-2, the device of the first embodiment has almost the similar breakdown withstand capability. However, the device of the first embodiment is superior to the EST-2, since the on-voltage of the first embodiment is lower than that of the EST-2. In the first embodiment, the second p-type base region 6 and n-type emitter region 8 in the surface portion of p-type base region 6 are shaped with stripes, and the first p-type base region 4 and n-type source region 7 in the surface portion of p-type base region 4 are shaped with stripes and facing opposite to each other for a long length. This structure prevents the current localization and facilitates lowering the on-resistance of the first embodiment without sacrificing the other characteristics.

Since n-type emitter region 8 contacts with cathode 11, the breakdown voltage of the first embodiment is improved.

Figure 8:
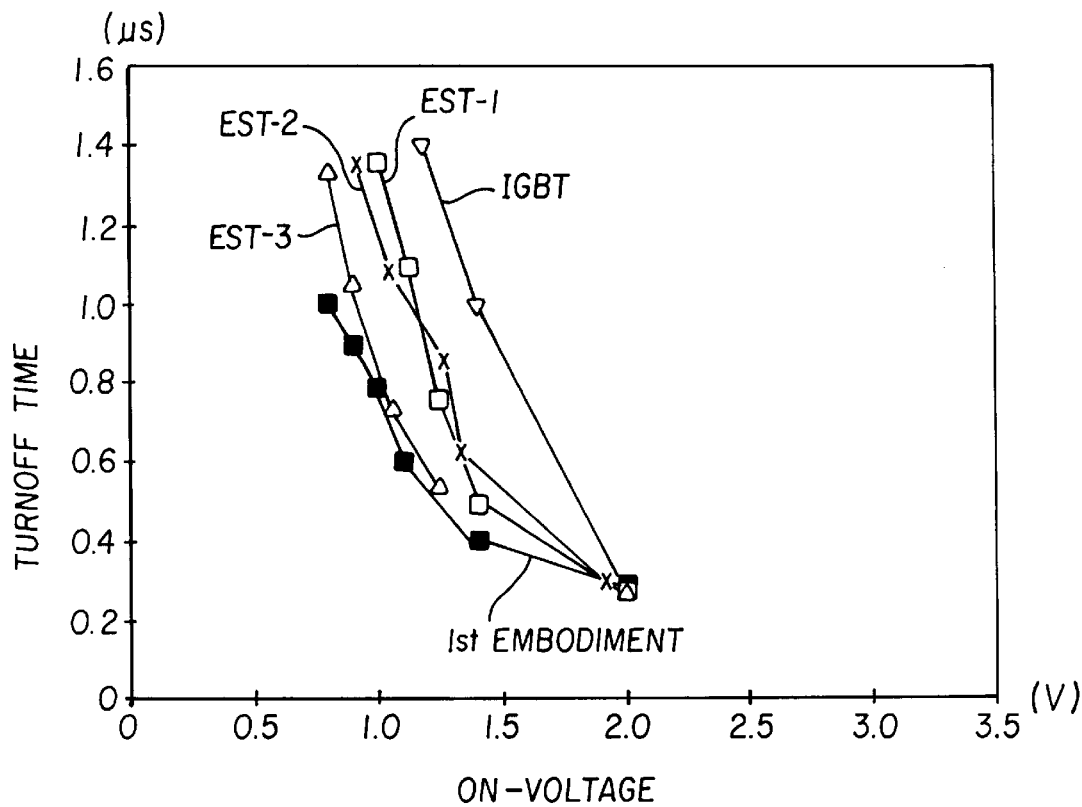
FIG. 8 is a set of curves comparing the tradeoff characteristics between the on-voltage and turnoff time of the devices of 600 V-class.

FIG. 8 is a set of curves comparing the tradeoff characteristics between the on-voltage and turnoff time of the foregoing devices of 600 V-class. In FIG. 8, the axis of abscissas represents the on-voltage and the axis of ordinates the turnoff time. The on-voltage is represented by the potential drop under the conduction of a current of 100 A/cm² at 25° C. The turnoff time was measured at 125° C. The device of the first embodiment with the structure of FIG. 1 and the pattern of FIG. 2 exhibits better tradeoff characteristics than those of the EST's and the IGBT.

A first experimental device, the carrier lifetime of which had been controlled by electron irradiation, was fabricated. The experimental device exhibits better tradeoff characteristics than those of the EST's and the IGBT. However, the device of the first embodiment exhibits better tradeoff characteristics between the on-voltage and the turnoff time than those of the experimental device. In the device of the first embodiment, crystal defects which work as the lifetime killers were localized near n⁺ buffer layer 2 by irradiating protons from the side of anode 12 to optimize the distribution of the lifetime killers. By optimizing the lifetime killer distribution, lifetime killer generation in the unwanted portions is prevented and the on-voltage rise by the unnecessary lifetime killers is avoided. As a result, the insulated gate thyristor of FIG. 1, the turnoff time of which is short and the on-voltage of which is low, is obtained. A second experimental device, the lifetime of which had been controlled by helium ion implantation, was fabricated. The dose amount of the implanted helium ions was almost same with the dose amount of protons in the device of FIG. 1. The second experimental device exhibits almost the same characteristics with those of the device of the first embodiment.

An amorphous silicon film, and such resistive films many used in place of the polycrystalline silicon film for the resistor 13.

Second Embodiment

Figure 3:
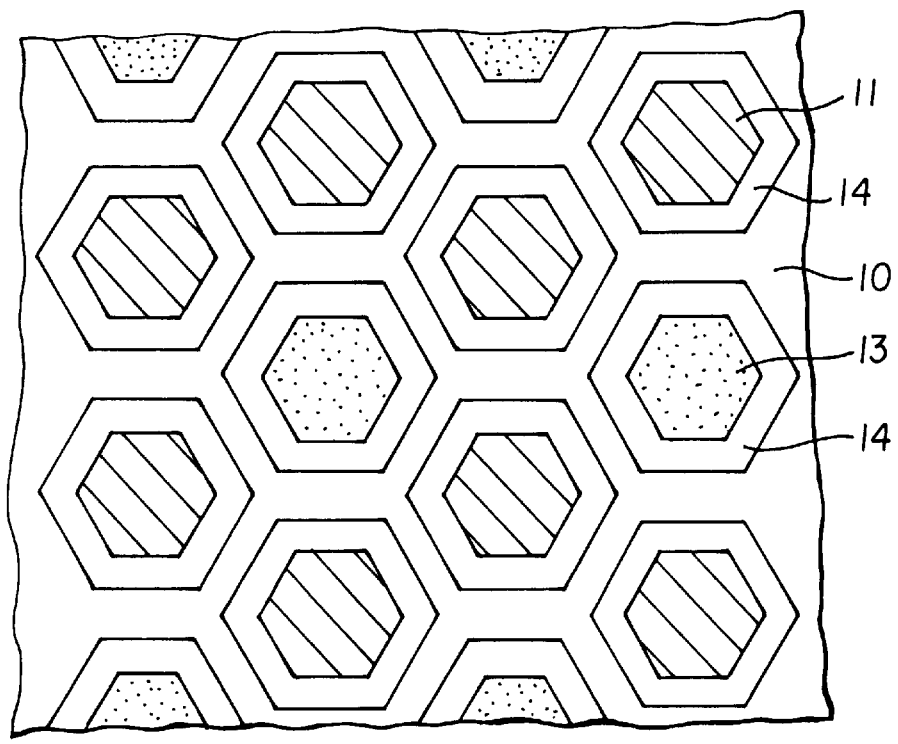
FIG. 3 is a horizontal cross section including a center of a gate electrode of an insulated gate thyristor of a second embodiment according to the invention.
Figure 6:
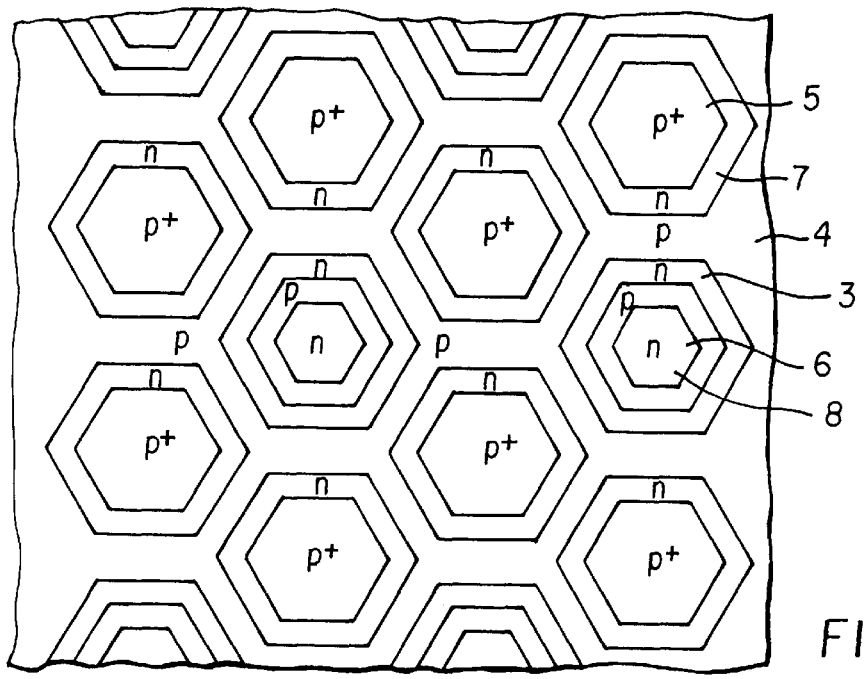
FIG. 6 is a planar pattern on the silicon substrate surface of the thyristor of the second embodiment.

FIG. 3 is a horizontal cross section containing a gate electrode 10 of an insulated gate thyristor of a second embodiment according to the invention. In the network of gate electrode 10, hexagonal cathodes 11 and polycrystalline silicon films 13 are arranged. Hexagonal cathodes 11 and polycrystalline silicon films 13 are isolated from one another by insulation films. A hexagonal polycrystalline silicon films 13 is surrounded by a hexagonal annular insulation film 14, which is surrounded by gate electrode 10. A hexagonal cathode 11 is surrounded by insulation film 14 on the other side of gate electrode 10. In practice, cathode 11 is often extended over gate electrode 10 with insulation film 14 interposed in-between. FIG. 6 is a planar pattern on the silicon substrate surface of the thyristor of the second embodiment. Referring now to FIG. 6, hexagonal n-type base layers 3 are arranged in a network of a first p-type base region 4. Six n-type source regions 7 are arranged such that the source regions surrounds n-type base layer 3. A second p-type base region 6 is in n-type base layer 3. An emitter region 8 is in second p-type base region 6. A p⁺ well region 5 is in n-type source region 7. The n-type source region 7 and p⁺ well region 5 contact with cathode 11 of FIG. 3. A polycrystalline silicon film 13 is disposed such that polycrystalline silicon film 13 contacts with n-type emitter region 8.

Since the first p-type base region 4 is formed in the second embodiment such that p-type base region 4 surrounds the second p-type base region 6, a current from n-type emitter region 8 is scattered to the surrounding first p-type base region 4, and current localization is not caused. Therefore, the device of the second embodiment exhibits high switching speed and breakdown voltage as well as large breakdown withstand capability.

Third Embodiment

Figure 7:
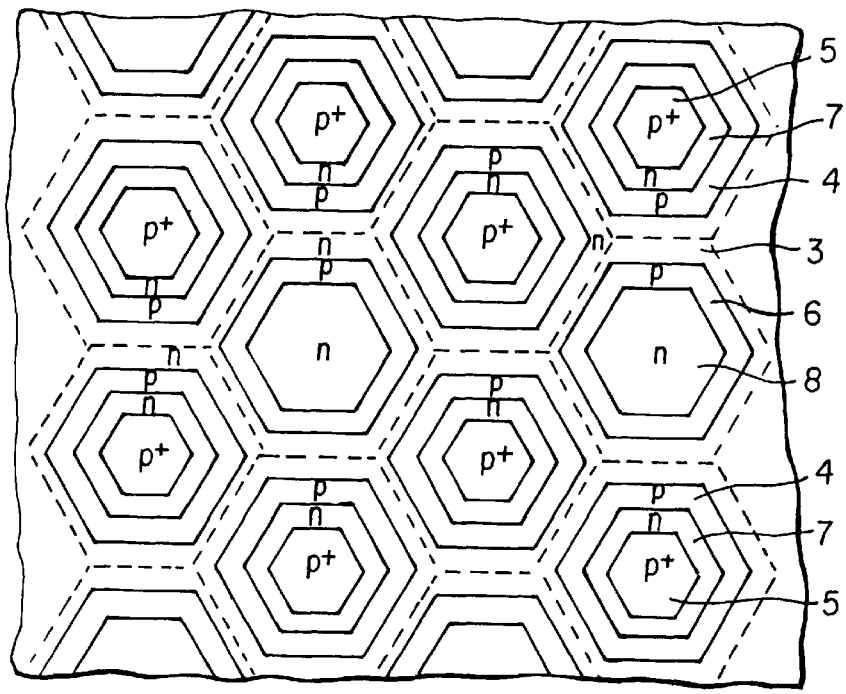
FIG. 7 is a planar pattern on a silicon substrate surface of an insulated gate thyristor of a third embodiment according to the invention.

FIG. 7 is a planar pattern on a silicon substrate surface of an insulated gate thyristor of a third embodiment according to the invention. The horizontal cross section including a gate electrode 10 of the third embodiment is similar to FIG. 3. Referring now to FIG. 7, a first p-type base region 4, an n-type source region 7 in the surface portion of p-type base region 4, a second p-type base region 6 and an n-type emitter region 8 in the surface portion of p-type base region 6 are formed through hexagonal windows opened through gate electrode 10. A cathode 11 contacts with first p-type base region 4 and n-type source region 7 through a contact hole bored through an insulation film 14 deposited on the side of gate electrode 10. The surface of the second p-type base region 6 is covered with insulation film 14. A polycrystalline silicon film 13 contacts with the surface of n-type emitter region 8. In this embodiment too, cathode 11 is often extended, in practice, over gate electrode 10 with insulation film 14 interposed in-between. The insulated gate thyristor of the third embodiment is manufactured in the same manner as the first embodiment. Due to the same reasons described above in relation to the second embodiment, the device of the third embodiment exhibits high switching speed and breakdown voltage as well as large breakdown withstand capability.

In the third embodiment, six units (each having a first p-type base region 4) indicated by dotted lines are arranged around the hexagonal second p-type base region 6. In addition, other various arrangement patterns may be adopted. The other device having a square, octagonal, dodecagonal, circular or elliptic pattern exhibits better tradeoff characteristics than those of the EST's and IGBT.

Fourth Embodiment

Figure 9:
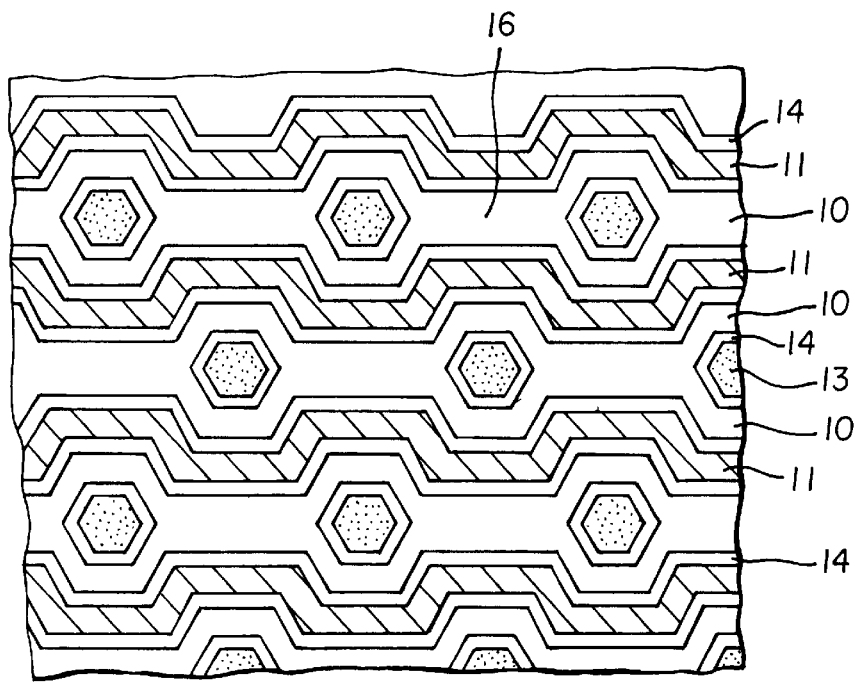
FIG. 9 is a horizontal cross section including a center of a gate electrode of an insulated gate thyristor of a fourth embodiment according to the invention.

FIG. 9 is a horizontal cross section including a center of a gate electrode 10 of an insulated gate thyristor of a fourth embodiment according to the invention. In the thyristor of the fourth embodiment, the patterns of a second p-type base region 6 and an n-type emitter region 8 in the surface portion of p-type base region 6 are hexagonal. An insulation film 14 on p-type base region 6 and n-type emitter region 8 is illustrated as hexagonal. Since p-type base region 6 and n-type emitter region 8 are under insulation film 14, their patterns are not shown in FIG. 9. A polycrystalline silicon film 13 contacts with the surface of n-type emitter region 8. A hexagonal annular gate electrode 10 is around a hexagonal annular insulation film 14 around the hexagonal polycrystalline silicon film 13. A cathode 11 meanders between the insulation films, each covering a side face of gate electrode 10. Though not shown in FIG. 9, an n-type source region 7, a first p-type base region 4 and p⁺ well region 5 are under cathode 11. Hexagonal gate electrodes 10 are connected to each other by a gate runner 16. Although meandering in the cross section of FIG. 9, cathode 11 extends over gate electrode 10 with insulation film 14 interposed in-between. By disposing the first p-type base region 4 and n-type source region 7 in the surface portion of p-type base region 4 around the second p-type base region 6, current localization at turnoff is avoided and the controllable current is increased. Naturally, the second p-type base region 6 and n-type emitter region 8 in the surface portion of p-type base region 6 may be shaped with any other patterns than hexagonal one. Due to the reasons described earlier, the device of the fourth embodiment exhibits high switching speed and breakdown voltage as well as large breakdown withstand capability.

Fifth Embodiment

Figure 10A:
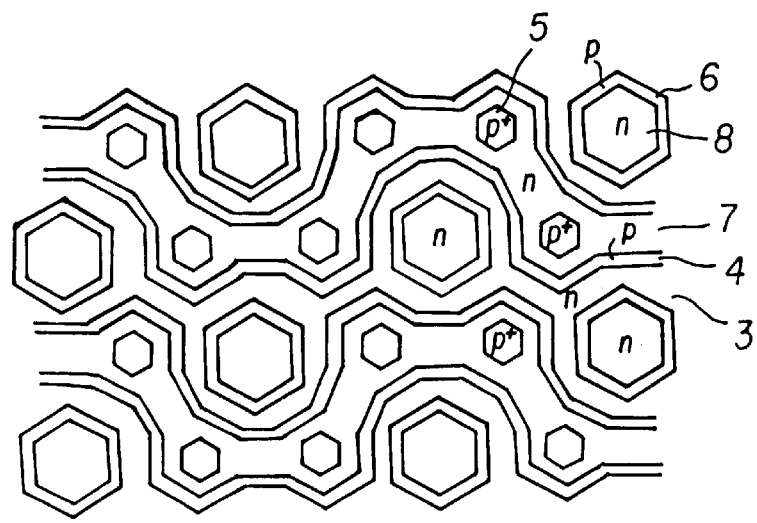
FIG. 10($a$) shows a diffusion region on a surface portion of an insulated gate thyristor of a fifth embodiment according to the invention.
Figure 10B:
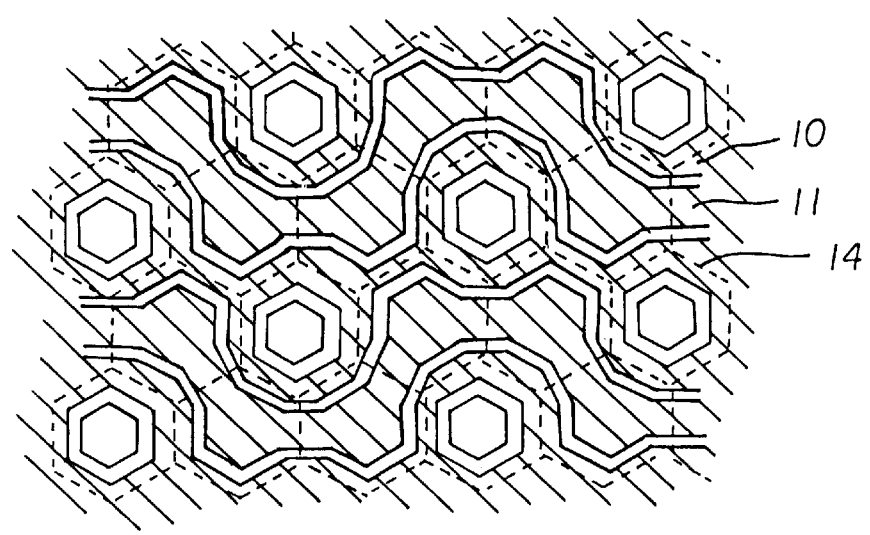

FIG. 10(*a*) shows diffusion regions on a surface portion of an insulated gate thyristor of a fifth embodiment according to the invention, which surface portion is exposed by removing a cathode 11, insulation film 14 and gate electrode 10 from the insulated gate thyristor of the fifth embodiment. FIG. 10(*b*) is a horizontal cross section including a center of a gate electrode 10 of the insulated gate thyristor of the fifth embodiment. Referring now to FIG. 10(*a*), a hexagonal second p-type base region 6 is formed in the surface portion of an n-type base layer 3, and an n-type emitter region 8 in p-type base region 6. The first p-type base region 4 is formed to be almost annular around p-type base region 6. An n-type source region 7 and a p⁺ well region 5 are formed inside p-type base region 4. The first p-type base region 4 and n-type source region 7 are formed by introducing impurities using a part of gate electrode 10 as a mask. The first p-type base region 4 is not shaped with a complete ring leaving a cut-out portion through which n-type base layers 3, 3 of the adjacent cells are connected with each other.

Referring now to FIG. 10(*b*), a hexagonal insulation film 14 is surrounded by a gate electrode 10, the side portion of which is covered by an insulation film 14. Cathode 11 is a curved belt between the insulation films 14 and 14. The hexagonal insulation film 14 is on the second p-type base region 6 and n-type emitter region 8 in p-type base region 6. An end of gate electrode 10 is on n-type emitter region 8 and another end of gate electrode 10 on n-type source region 7. Cathode 11 contacts with the surfaces of n-type source region 7 and p⁺ well region 5. If we consider that the portion surrounding the hexagonal insulation film 14 consists of six unit cells divided by dotted lines, each unit cell includes a quasi-hexagonal annular gate electrode 10, cathode 11 and insulation film 14 separating gate electrode 10 and cathode 11 from each other. The quasi-hexagonal annular gate electrode 10 has two cut-out portions, each on a side thereof. Through the cut-out portion, the first p-type base regions 4 and n-type source regions 7 of the adjacent cells are connected respectively to each other. Though cathode 11 extends over gate electrode 10 with insulation film 14 interposed in-between, cathode 11 meanders on the cross section of FIG. 10(*b*). Since the basic pattern of the structure of FIGS. 10(*a*) and 10(*b*) is hexagonal and most closely packed, the fifth embodiment facilitates utilizing the silicon substrate highly efficiently. Since the first p-type base region 4 and n-type source region 7 are widened, the on-voltage of the device of the fifth embodiment lowers. Similarly as the insulated gate thyristor of the first embodiment, the device of the fifth embodiment realizes a low on-voltage and wide RBSOA, since the pn junction between n-type emitter region 8 and the second p-type base region 6 enters uniformly into the reverse recovery process and since p-type base region 6 provides the hole current with a by-path.

Sixth Embodiment

Figure 11:
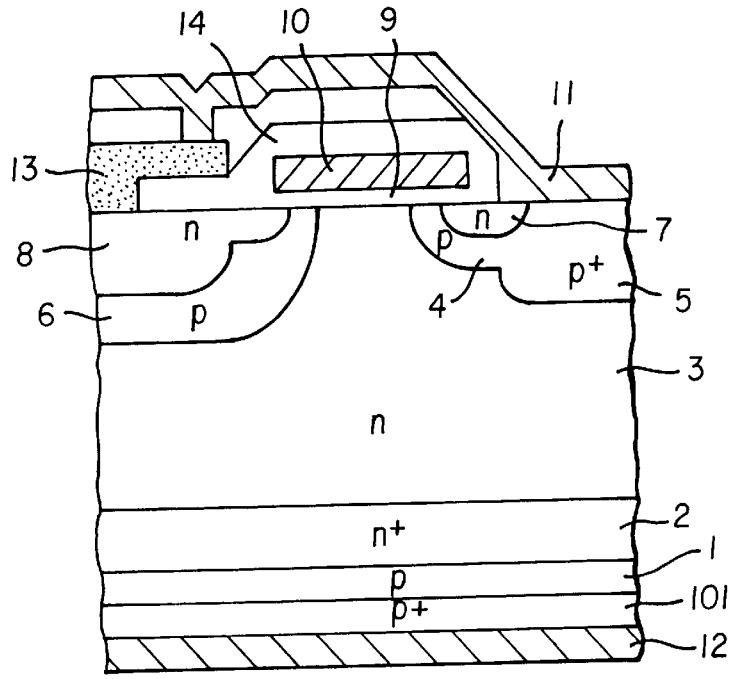
FIG. 11 is a cross section of a part of an insulated gate thyristor of a sixth embodiment according to the invention.

FIG. 11 is a cross section of a part of an insulated gate thyristor of a sixth embodiment according to the invention. The structure of the sixth embodiment well resembles that of the insulated gate thyristor of the first embodiment illustrated in FIG. 1. The sixth embodiment is different from the first embodiment in that a heavily doped p$^+$ contact layer (anode layer) 101 is formed on the back surface of a p-type emitter layer 1. A polycrystalline silicon film 13 is on an n-type emitter region 8 similarly as in the first and second embodiments.

The p$^+$ anode layer 101 is formed, for example, by boron ion implantation under the acceleration voltage of 50 kV and dose amount of 5×10$^{15}$ cm$^{-2}$. By disposing this heavily doped p$^+$ anode layer 101, the contact resistance of anode 12 is lowered and an insulated gate thyristor with extremely low on-voltage is obtained.

Figure 12:
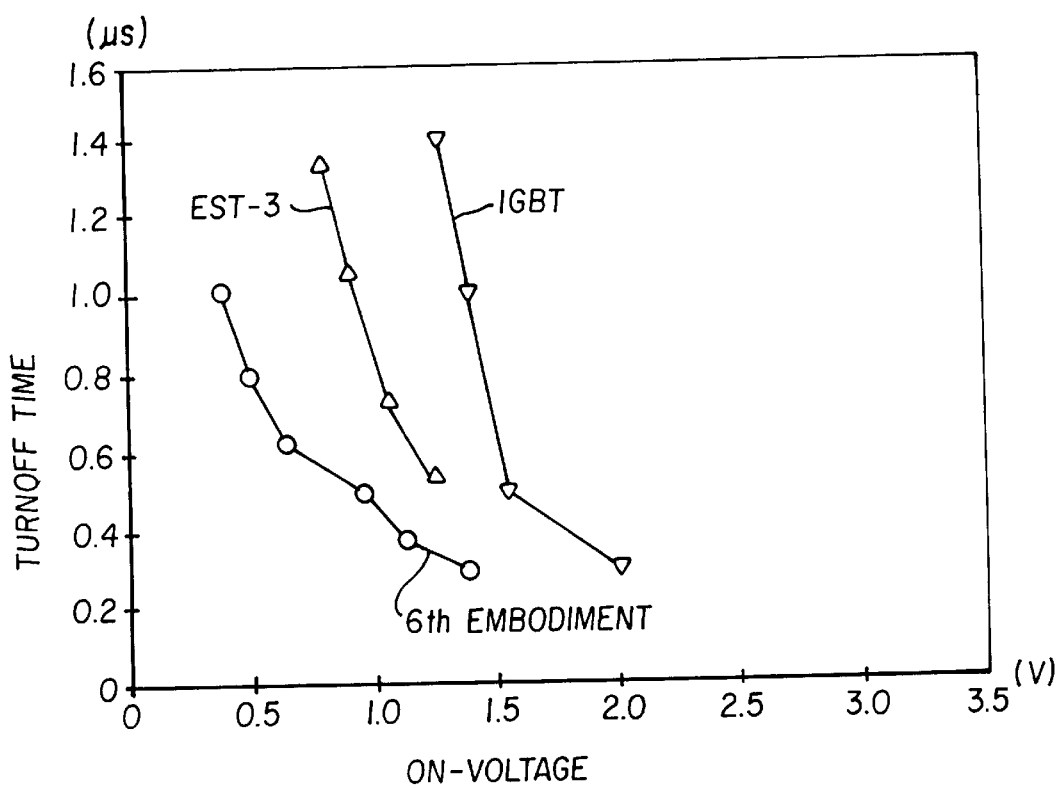
FIG. 12 is a set of curves comparing the tradeoff characteristics between the on-voltage and turnoff time of the sixth embodiment with those of the EST-3 of 600 V-class and the IGBT of 600 V-class.

FIG. 12 is a set of curves comparing the tradeoff characteristics between the on-voltage and turnoff time of the sixth embodiment with those of the EST-3 of 600 V-class and the IGBT of 600 V-class. In FIG. 12, the axis of abscissas represents the on-voltage and the axis of ordinates the turnoff time. The on-voltage is represented by the potential drop under the conduction of a current of 100 A/cm$^2$ at 25° C. The turnoff time was measured at 125° C. The device of the sixth embodiment exhibits better tradeoff characteristics than those of the first embodiment.

The insulated gate thyristor of the sixth embodiment has a planar stripe pattern. An insulated gate thyristor with anyone of a hexagonal and other planar patterns can be fabricated in the same manner as the sixth embodiment. The insulated gate thyristors with a modified planar pattern exhibit the characteristics as excellent as those of the sixth embodiment.

Seventh Embodiment

Figure 13:
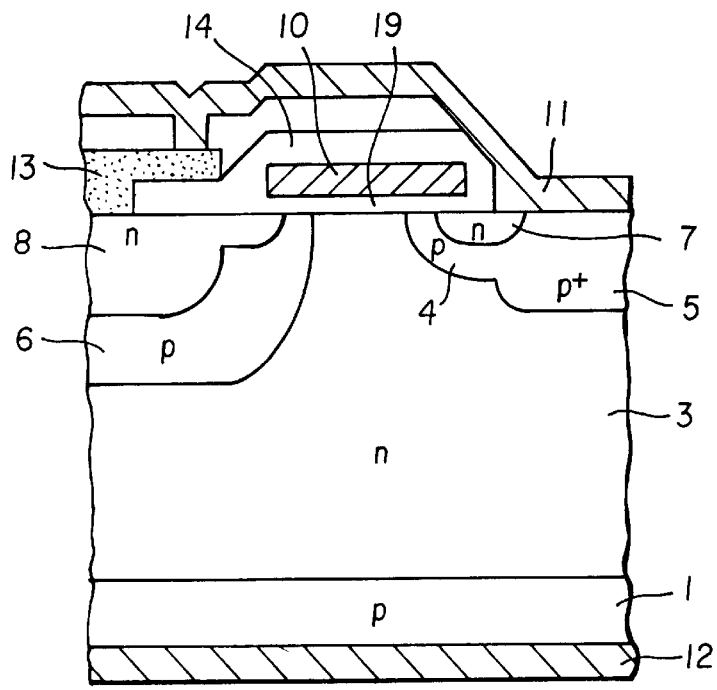
FIG. 13 is a cross section of a part of an insulated gate thyristor of a seventh embodiment according to the invention.

In all the embodiments described above, n$^+$ buffer layer 2 is disposed between p-type emitter layer 1 and n-type base layer 3. The present invention is applicable to the devices which lacks n$^+$ buffer layer 2. FIG. 13 is a cross section of a part of an insulated gate thyristor of a seventh embodiment according to the invention. The device of the seventh embodiment was fabricated on a bulk silicon wafer, not on an epitaxial wafer. Though the structure on a major surface of an n-type base layer 3 is same with that of the first embodiment, a p-type emitter layer 1 is formed directly on another major surface of an n-type base layer 3. A polycrystalline silicon film 13 is on an n-type emitter region 8.

Figure 14:
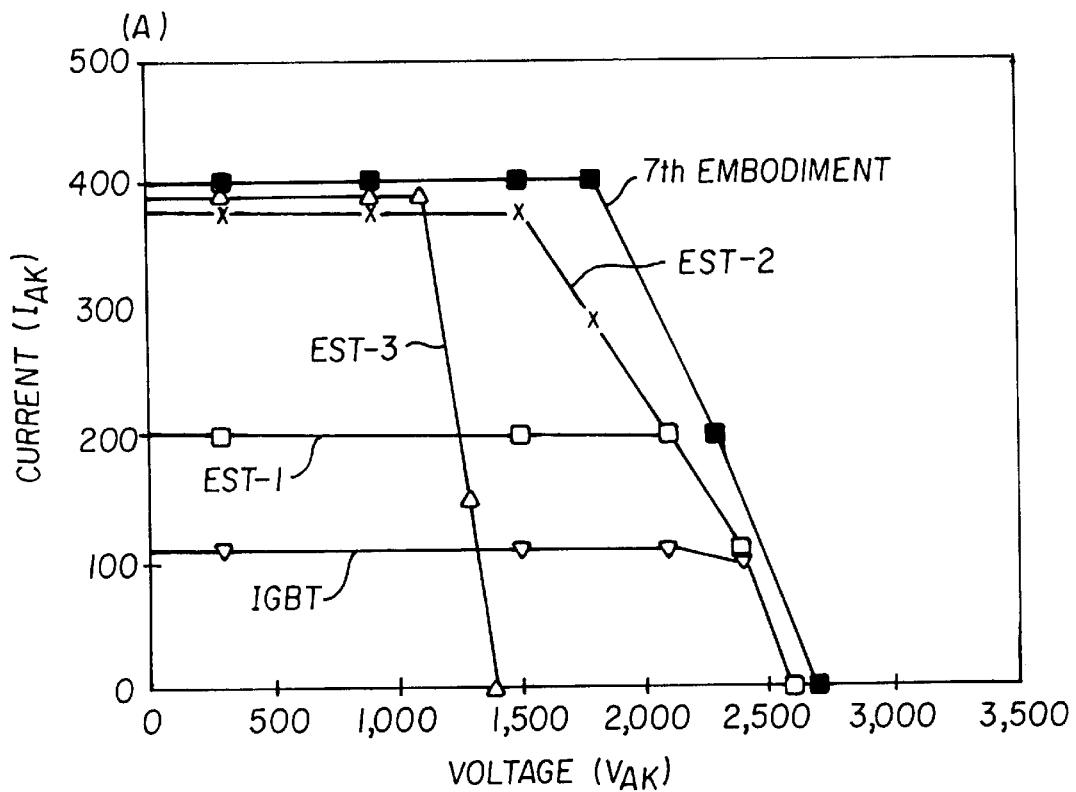
FIG. 14 compares the RBSOA's of the devices of 250 V class of the seventh embodiment, EST-1, EST-2, EST-3 and IBGT.

FIG. 14 compares the RBSOA's of the devices of 2500 V-class of the seventh embodiment with the structure of FIG. 13 and the planar pattern of FIG. 2, EST-1, EST-2, EST-3 and IBGT at 125° C. In FIG. 14, the axis of abscissas represents the voltage between the anode and cathode, and the axis of ordinates the current. The n-type base layer 3 in the device of the seventh embodiment is 440 μm in thickness. The other dimensions of the device of the seventh embodiment are same with those of device of the first embodiment. The on-voltage is 1.1 V for the device of the seventh embodiment, 2.0 V for the EST-1, 2.2 V for the EST-2, 1.4 V for the EST-3, and 3.3 V for the IBGT. The 2500 V-class device of the invention which uses a bulk wafer exhibits, as the 600 V-class device on the epitaxial wafer does, a much wider RBSOA and lower on-voltage as compared with the EST's and IGBT. This is attributed to prevention of current localization by the structure, in which the second p-type base region 6 and n-type emitter region 8 in the surface portion of p-type base region 6 are shaped with stripes, and the first p-type base region 4 and n-type source region 7 in the surface portion of p-type base region 4 are shaped with stripes and facing opposite to each other for a long length. Since n-type emitter region 8 contacts to cathode 11, the breakdown voltage of the device of the seventh embodiment is improved by 10% in comparison with that of the other devices.

That is, the present invention effectively widens the reverse bias safe operation area (RBSOA) without impairing the on-voltage irrespective of the resistivity of n-type base region 3 and the current amplification factor of the pnp wide base transistor. To say in other words, the present invention is effective for improving the RBSOA irrespective of the rated voltage of the device and growth method of the semiconductor crystal for the substrate.

Figure 15:
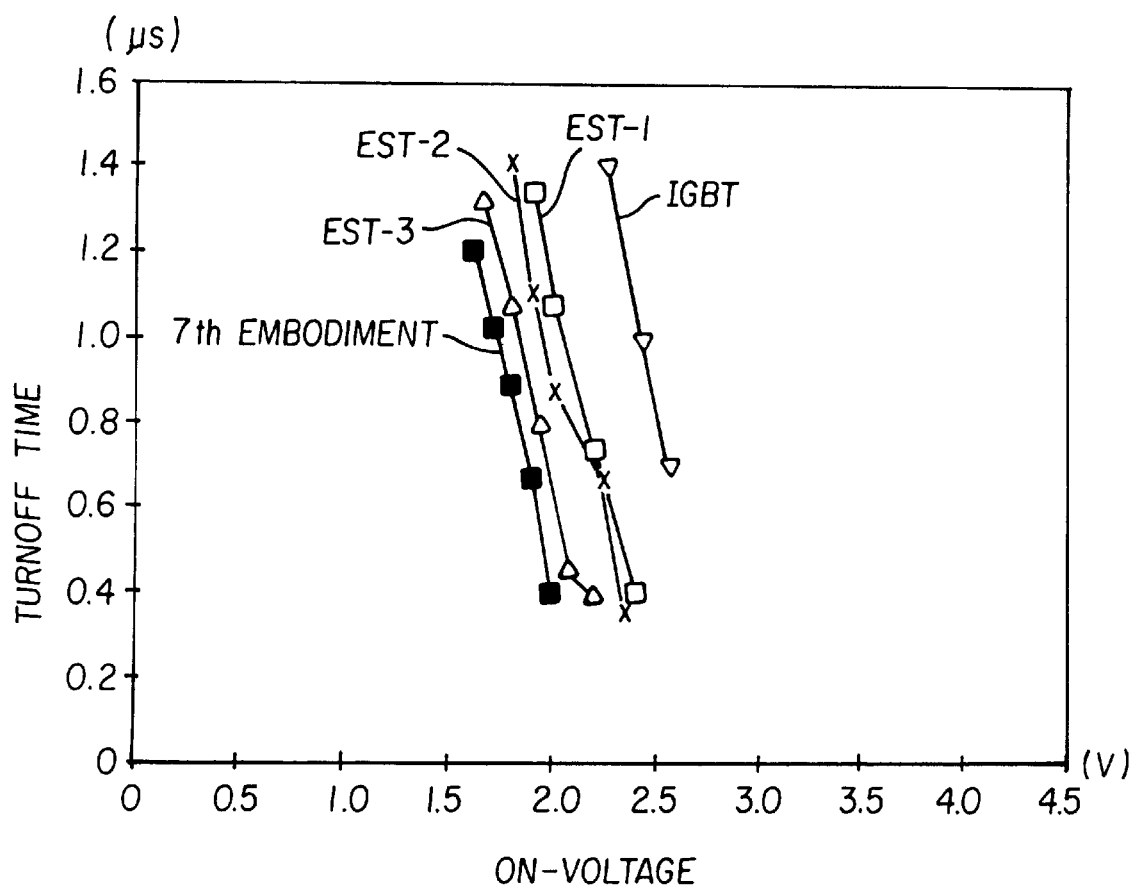
FIG. 15 is a set of curves comparing the tradeoff characteristics between the on-voltage and turnoff time of the 2500 V-class device of the seventh embodiment with those of the 2500 V-class EST-1, EST-2, EST-3, and IBGT.

FIG. 15 is a set of curves comparing the tradeoff characteristics between the on-voltage and turnoff time of the 2500 V-class device of the seventh embodiment with those of the comparative 2500 V-class devices. In FIG. 15, the axis of abscissas represents the on-voltage and the axis of ordinates the turnoff time. The on-voltage is represented by the potential drop under the conduction of a current of 50 A/cm$^2$ at 25° C. The turnoff time was measured at 125° C. The device of the seventh embodiment, having the structure of FIG. 13 and the planar pattern of FIG. 2, exhibits better tradeoff characteristics than those of the EST's and IGBT.

The carrier lifetime of the insulated gate thyristor was controlled by proton irradiation. An experimental device, the carrier lifetime of which had been controlled by helium ion implantation, was fabricated in the same manner as the seventh embodiment. The experimental device exhibits almost the same RBSOA and tradeoff characteristics with those of the seventh embodiment, the carrier lifetime of which has been controlled by proton irradiation. Obviously, helium ion implantation generates localized lifetime killers.

The 2500 V-class device of the seventh embodiment having a hexagonal, planar pattern as shown in FIGS. 6 and 7, as well as the 2500 V-class devices of the invention having either one of the other planar patters, such as octagonal, dodecagonal, circular and elliptic, exhibits better tradeoff characteristics than those of the EST's and IGBT.

Eighth Embodiment

Figure 16:
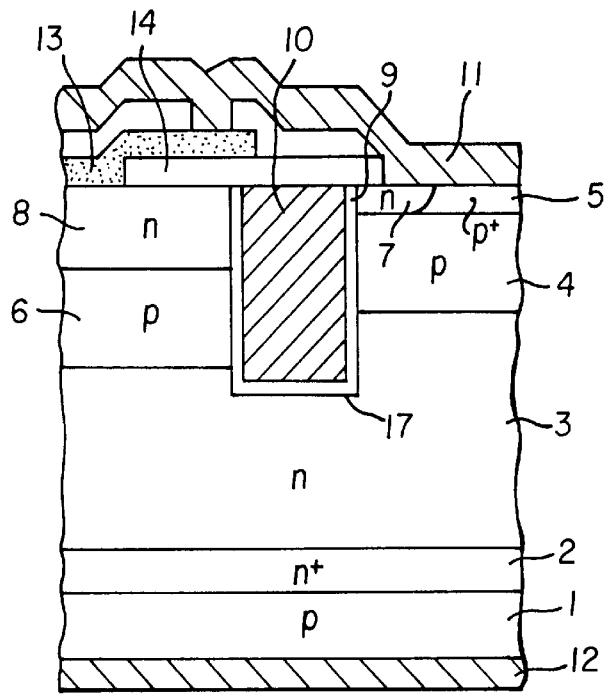
FIG. 16 is a cross section of a part of an insulated gate thyristor of a eighth embodiment according to the invention.

FIG. 16 is a cross section of a part of an insulated gate thyristor of a eighth embodiment according to the invention. The illustrated cross sectional structure is somewhat different from the structures of the insulated gate thyristors described above. Referring now to FIG. 16, a trench 17 is dug from a first surface of a highly resistive n-type base layer 3. A first p-type base region 4 and a second p-type base region 6 are formed on both sides of trench 17. An n-type source region 7 is in the surface portion of the first p-type base region 4 and an n-type emitter region 8 in the surface portion of the second p-type base region 6. The n-type source region 7 and n-type emitter region 8 are exposed to the wall of trench 17. The inner wall of trench 17 is covered with a gate oxide film 9, on which a polycrystalline silicon gate electrode 10 is deposited such that the polycrystalline gate electrode 10 fills inside the trench 10 and such that an n-channel MOSFET is constructed. A p$^+$ well region 5 is formed in a part of p-type base region 4 to prevent the parasitic thyristor from latching up. A cathode 11 contacts with the surfaces of n-type source region 7 and p$^+$ well region 5. The p$^+$ well region 5 may be shallower than n-type source region 7, since the structure having trench 17 is more hardly latched up than the ordinary planar structure. The second p-type base region 6 is diffused more deeply than the first p-type base region 4. On the other side of the device, a p-type emitter layer 1 is formed on an n$^+$ buffer layer 2.

Especially in this embodiment, the diffusion depth of n-type emitter region 8 varies in two steps. The n-type emitter region 8 is as deep as n-type source region 7 near n-type source region 7 and deeper than n-type source region 7 away from n-type source region 7. Other depth profiles may be adopted to n-type emitter region 8. A polycrystalline silicon film 13 connected to cathode 11 is formed on n-type emitter region 8. The upper surface of gate electrode 10 is covered with an insulation film 14 of phosphorus glass (PSG) and such insulators. In FIG. 16, cathode 11 extends also over n-type emitter region 8 with insulation 14 interposed in-between. The carrier lifetime has been controlled by proton irradiation.

The trench 17 is 1 $\mu$m in width and 8 $\mu$m in depth. The diffusion depth is 3 $\mu$m for p-type base region 4, 5 $\mu$m for p-type region 6, 2 $\mu$m for n-type emitter region 8, and 0.4 $\mu$m for n-type source region 7. The cell pitch is 3.5 $\mu$m.

Figure 17:
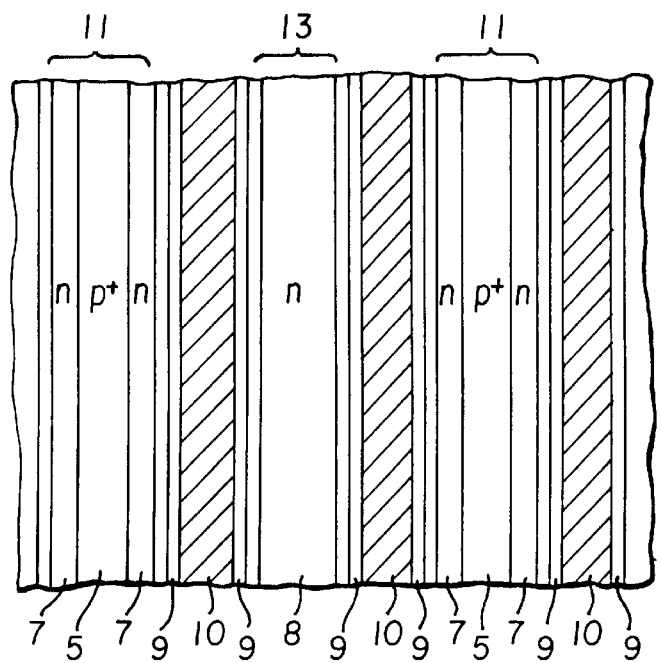
FIG. 17 is a planar pattern on the silicon substrate surface of the insulated gate thyristor which includes a plurality of the cell of FIG. 16.

FIG. 17 is a planar pattern on the silicon substrate surface of the insulated gate thyristor which includes a plurality of the cell of FIG. 16. In FIG. 17, the like parts with those of FIG. 16 are designated by the same reference numerals. The n-type emitter regions 8, n-type source regions 7, $p^+$ well regions 5, and gate electrodes 10 which separate these regions are arranged in stripes. The reference numeral 9 designates a gate oxide film. A fine solid line in n-type source region 7 indicates the edge of the contact portion thereof with the cathode, and a fine line in n-type emitter region 8 the edge of the contact portion with the polycrystalline silicon film.

The thus constructed insulated gate thyristor is turned on and off, as the embodiments described above, by applying a signal voltage to gate electrode 10.

In the insulated gate thyristor of FIGS. 16 and 17, different from the EST of FIG. 41, the second p-type base region 6 is covered with an insulation film, and n-type emitter region 8 is kept, via polycrystalline silicon film 13 thereon, at the same potential with cathode 11. Due to this potential scheme, the device of the eighth embodiment dose not need any hole current flowing in the second p-type base region in Z-direction, and quickly shifts from the IGBT mode to the thyristor mode. Since electrons are injected uniformly from entire n-type emitter region 8, the on-voltage is lowered. Since the pn junction between n-type emitter region 8 and p-type base region 6 recovers uniformly by the potential difference in turning-off, the current localization is avoided and the RBSOA of the insulated gate thyristor of the eighth embodiment is drastically widened.

Figure 18:
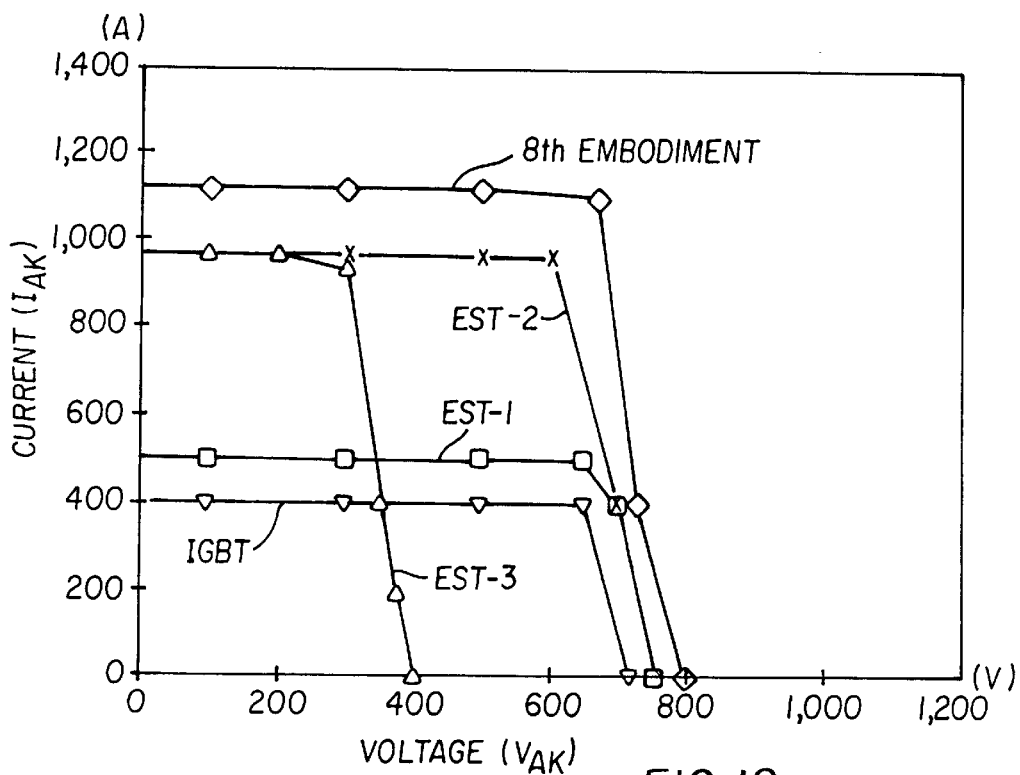
FIG. 18 is a set of curves comparing the RBSOA of the device of the eighth embodiment with those of the EST-1, EST-2, EST-3 and IGBT.

FIG. 18 is a set of curves comparing the RBSOA, measured with the circuit of FIG. 5 at 25° C., of the device of the eighth embodiment with those of the EST-1, EST-2, EST-3 and IGBT. In FIG. 18, the axes of abscissas and ordinates are same with those in FIG. 4. As can be seen from FIG. 18, the device of the eighth embodiment has a wider safe operation area indicating that the device of the eighth embodiment exhibits larger breakdown withstand capability than that of the comparative devices.

FIG. 18 describes the results for the 600 V-class devices, which use the epitaxial wafer described in conjunction with the first embodiment. The chip size was 1 cm². The on-voltage defined as the voltage drop under the current conduction of 100 A/cm² is 0.8 V for the insulated gate thyristor of the eighth embodiment. As we know from FIG. 18, the safe operation area of the device of the eighth embodiment is three times as wide as that of the IGBT, and 2.5 times as wide as those of the EST-1 and EST-3. The device of the eighth embodiment exhibits large breakdown withstand capability. Also can be seen from FIG. 18, the on-voltage of the device of the eighth embodiment is lower than those of the comparative devices. The device of the eighth embodiment exhibits the breakdown withstand capability 1.2 times as much as that of the EST-2. Thus, the device of the eighth embodiment with the planar pattern of FIG. 17 realizes low on-voltage without sacrificing the other characteristics.

Figure 19:
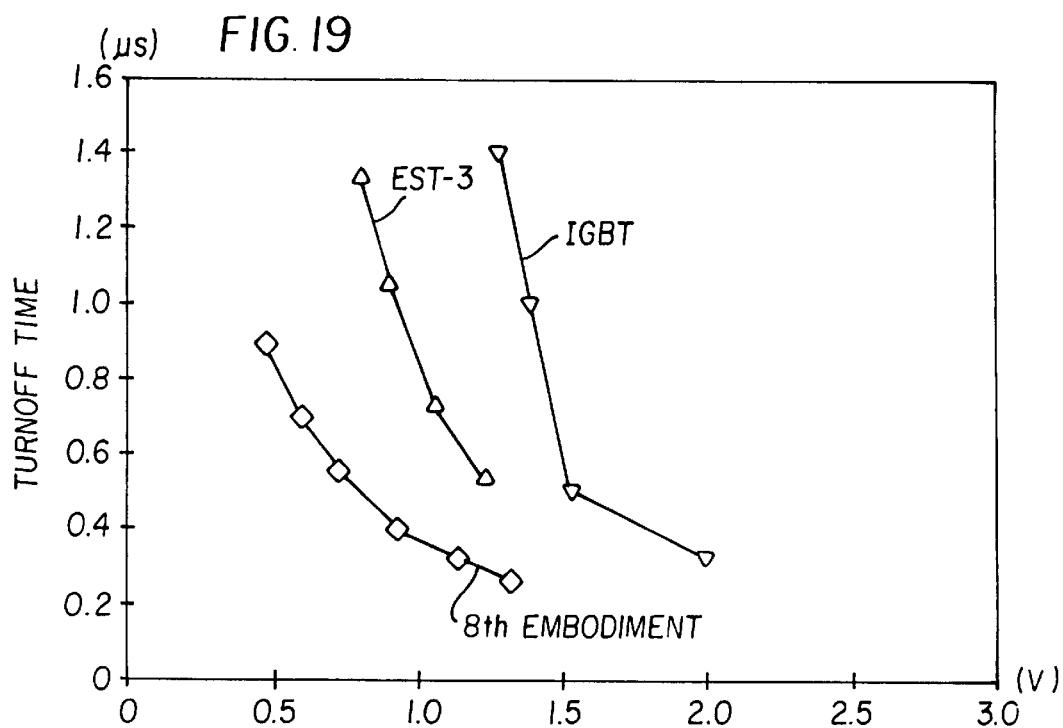
FIG. 19 is a set of curves comparing the tradeoff characteristics between the on-voltage and turnoff time of the eighth embodiment with those of the comparative 600 V-class devices.

FIG. 19 is a set of curves comparing the tradeoff characteristics between the on-voltage and turnoff time of the eighth embodiment with those of the comparative 600 V-class devices. In FIG. 19, the axis of abscissas represents the on-voltage and the axis of ordinates the turnoff time. The on-voltage is represented by the potential drop under the conduction of a current of 100 A/cm² at 25° C. The turnoff time was measured at 125° C. The device of the eighth embodiment with the planar pattern of FIG. 17 exhibits better tradeoff characteristics than those of the comparative insulated gate thyristors.

The better tradeoff characteristics of the eighth embodiment may be attributable to its structure, in which the second p-type base region 6 and n-type emitter region 8 in the surface portion of p-type base region 6 are shaped with stripes, and the first p-type base region 4 and n-type source region 7 in the surface portion of p-type base region 4 are shaped with stripes and facing opposite to each other for a long length. This structure prevents the current localization. By adopting the trench gate structure, the junction FET effect is reduced, high channel density is realized due to the reduced cell pitch, and the resistance connected in series to the thyristor portion consisting of p-type emitter layer 1, $n^+$ buffer layer 2 and n-type base layer 3, p-type base region 6, and n-type emitter region 8 is reduced. Thus, the trench gate structure contributes to on-voltage lowering. By making n-type emitter region 8 contact with cathode 11 via polycrystalline silicon film 13, excellent breakdown voltage characteristics are realized in the insulated gate thyristor of the eighth embodiment, the carriers are swept out quickly at turning-off, and a high switching speed is realized.

In the device of the eighth embodiment, crystal defects which work as the lifetime killers were localized near $n^+$ buffer layer 2 by irradiating protons from the side of anode 12 to optimize the distribution of the lifetime killers. By optimizing the lifetime killer distribution, lifetime killer generation in the unwanted portions is prevented and the on-voltage rise by the unnecessary lifetime killers is avoided.

Ninth Embodiment

Figure 20:
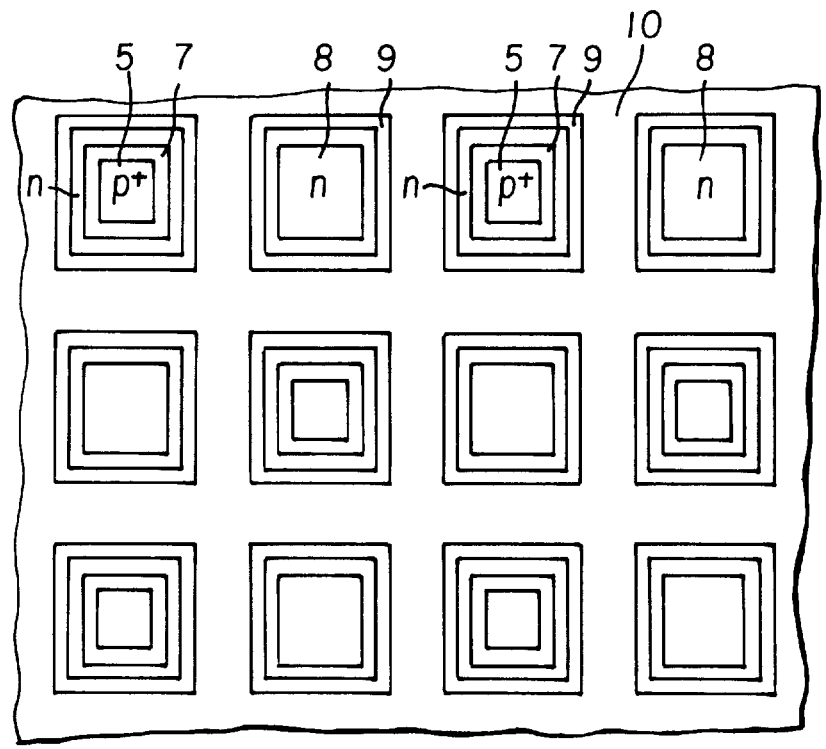
FIG. 20 is a planar pattern on a silicon substrate surface of an insulated gate thyristor of a ninth embodiment according to the invention.

FIG. 20 is a planar pattern on a silicon substrate surface of an insulated gate thyristor of a ninth embodiment according to the invention. Referring now to FIG. 20, a gate electrode 10 is buried in a trench 17 with a gate oxide film 9 interposed in-between. The trench 17 extends two-dimensionally. An n-type source region 7 is on each of four sides of an n-type emitter region 8 with the trench 17 interposed in-between. A $p^+$ well region 5 is in n-type source region 7. Though not shown in the figure, a second p-type base region is under n-type emitter region 8, and a first p-type base region under n-type source region 7. A fine solid line in n-type source region 7 indicates an edge of the contact portion thereof with a cathode, and a fine solid line in n-type emitter region 8 indicates an edge of the contact portion thereof with a polycrystalline silicon film.

Because the device of the ninth embodiment adopts the trench structure to greatly increase the cell density, and because the second p-type base region 6 and n-type emitter region 8 in the surface portion of n-type emitter region 8 are shaped with squares, and the first p-type base region 4 around p-type base region 6 and n-type source region 7 in the surface portion of p-type base region 4 are facing opposite to each other for a long length, current localization is prevented from causing, the RBSOA is widened and the on-voltage is lowered.

Tenth Embodiment

Figure 21:
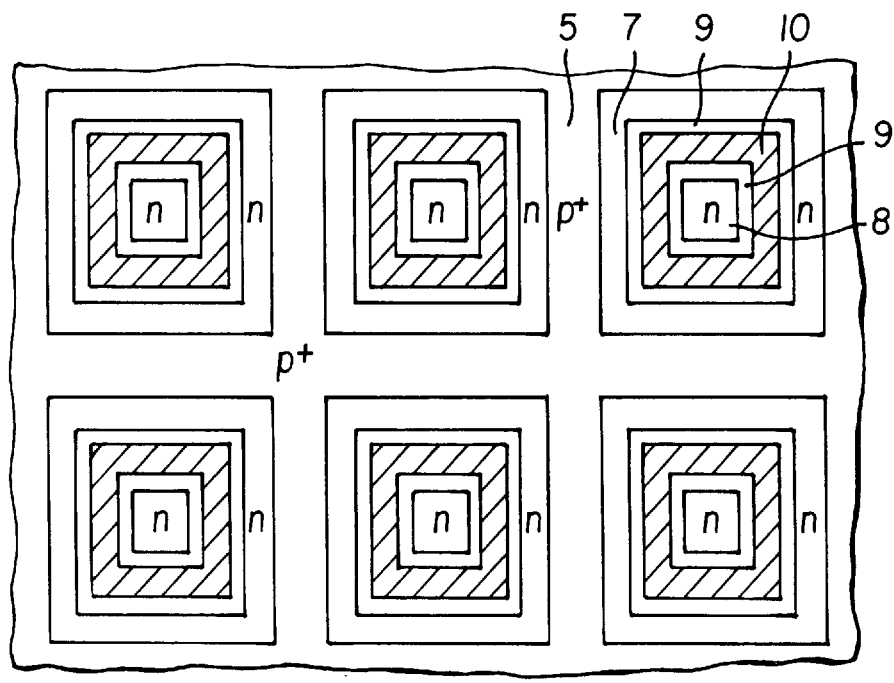
FIG. 21 is a planar pattern on a silicon substrate surface of an insulated gate thyristor of a tenth embodiment according to the invention.

FIG. 21 is a planar pattern on a silicon substrate surface of an insulated gate thyristor of a tenth embodiment according to the invention. Referring now to FIG. 21, an n-type emitter region 8 is in a square annular gate electrode 10 buried in a trench 17 with a gate oxide film interposed in-between. An n-type source region 7 is around gate electrode 10, and a p$^+$ well region 5 is around n-type source region 7. Though not shown in the figure, a second p-type base region is under n-type emitter region 8, and a first p-type base region under n-type source region 7. Gate electrodes 10 are connected to each other by the not shown conductors on the silicon surface. A fine solid line in n-type source region 7 indicates an edge of the contact portion thereof with a cathode, and a fine solid line in n-type emitter region 8 indicates an edge of the contact portion thereof with a polycrystalline silicon film.

Because the device of the tenth embodiment adopts the trench structure to greatly increase the cell density, and because the second p-type base region 6 and n-type emitter region 8 in the surface portion of n-type emitter region 8 are shaped with squares, and the first p-type base region 4 around p-type base region 6 and n-type source region 7 in the surface portion of p-type base region 4 are facing opposite to each other for a long length, current localization is prevented from causing, the RBSOA is widened and the on-voltage is lowered.

Eleventh Embodiment

An insulated gate thyristor of an eleventh embodiment according to the invention employs a bulk silicon wafer which lacks an n$^+$ buffer layer and has a structure similar to that of the eighth embodiment of FIG. 16 is built. A polycrystalline silicon film, connected to a cathode, is formed on an n-type emitter region.

Figure 22:
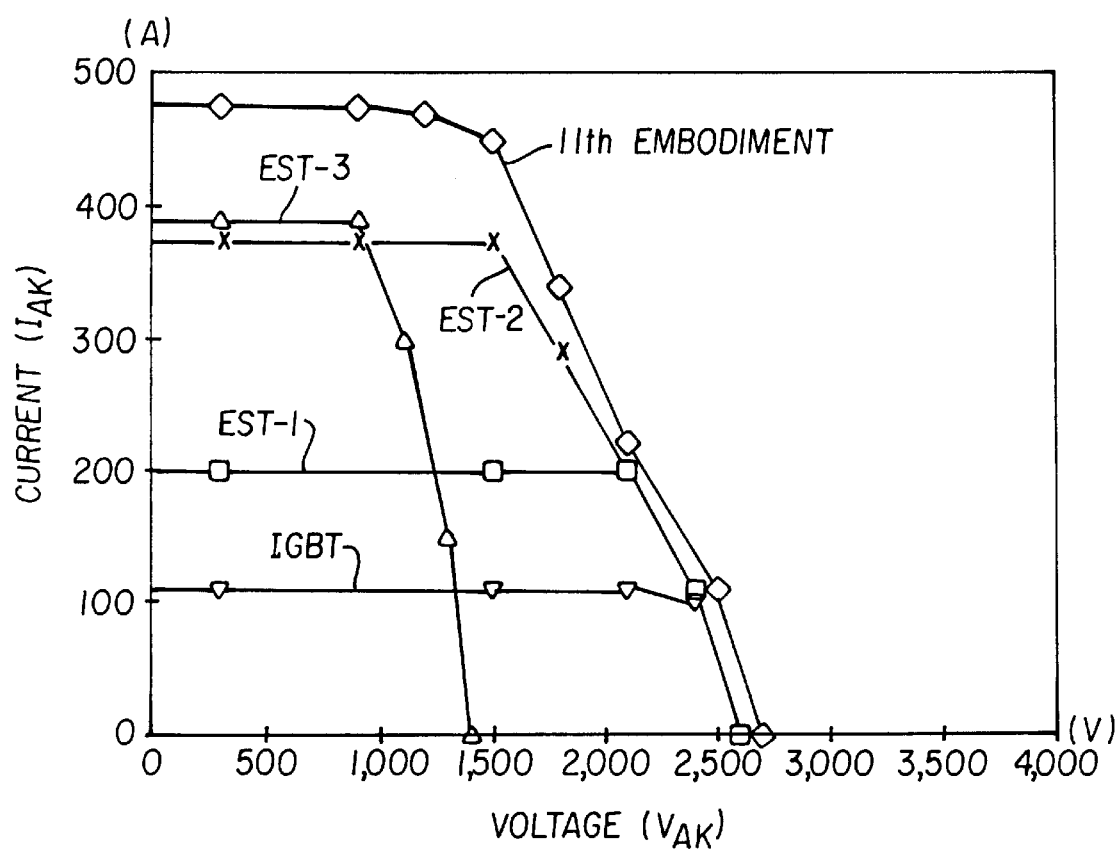
FIG. 22 is a set of curves comparing the RBSOA's of the devices of 2500 V-class of the eleventh embodiment with the planar pattern of FIG. 17, EST-1, EST-2, EST-3, and IBGT.

FIG. 22 a set of curves comparing the RBSOA's of the devices of 2500 V-class of the eleventh embodiment with the planar pattern of FIG. 17, EST-1, EST-2, EST-3, and IBGT at 125° C. In FIG. 22, the axis of abscissas represents the voltage between the anode and cathode, and the axis of ordinates the current. The n-type base layer 3 in the device of the eleventh embodiment is 440 μm in thickness. The on-voltage of the device of the eleventh embodiment is 0.9 V. The carrier lifetime of the device of the eleventh embodiment has been controlled by proton irradiation. The 2500 V-class device of the invention which uses a bulk wafer exhibits, as the 600 V-class device on the epitaxial wafer does, a much wider RBSOA and lower on-voltage as compared with the EST's and IGBT. That is, the present invention effectively widens the reverse bias safe operation area (RBSOA) without impairing the on-voltage irrespective of the resistivity of n-type base region 3 and the current amplification factor of the pnp wide base transistor. To say in other words, the present invention is effective for improving the RBSOA irrespective of the rated voltage of the device and growth method of the semiconductor crystal for the substrate.

Figure 23:
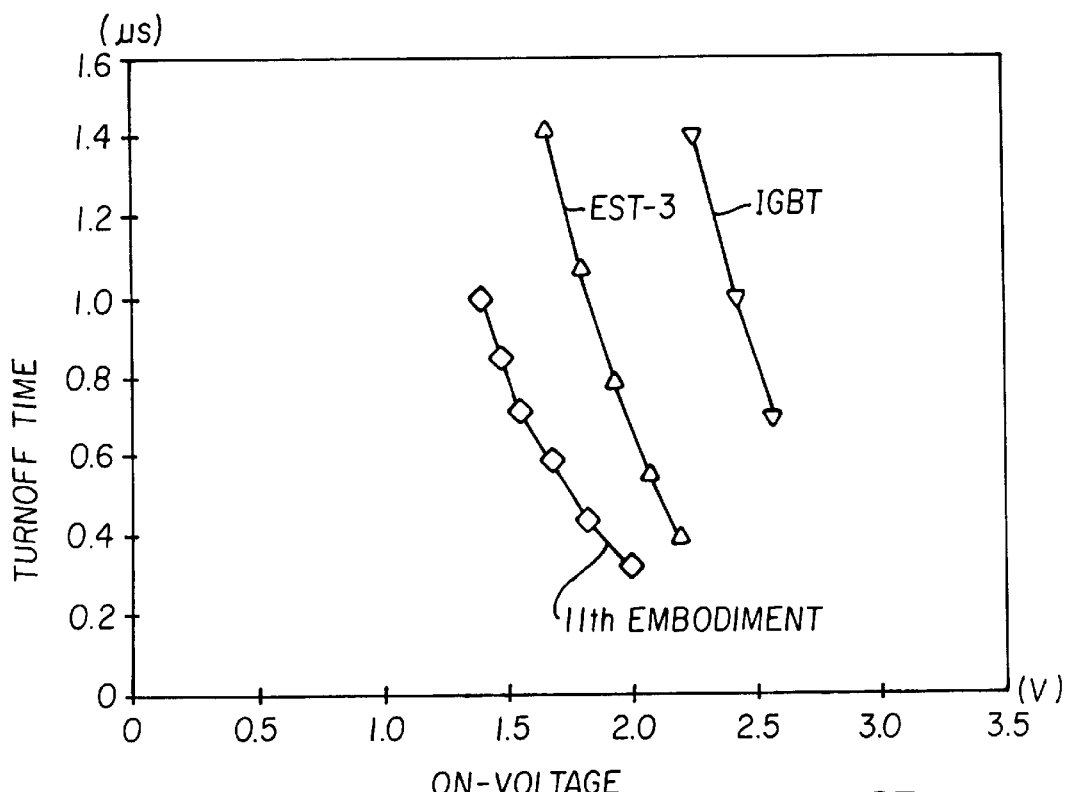
FIG. 23 is a set of curves comparing the tradeoff characteristics between the on-voltage and turnoff time of the 2500 V-class device of the eleventh embodiment with those of the comparative 2500 V-class devices.

FIG. 23 is a set of curves comparing the tradeoff characteristics between the on-voltage and turnoff time of the 2500 V-class device of the eleventh embodiment with those of the comparative 2500 V-class devices. In FIG. 23, the axis of abscissas represents the on-voltage and the axis of ordinates the turnoff time. The on-voltage is represented by the potential drop under the conduction of a current of 50 A/cm$^2$ at 25° C. The turnoff time was measured at 125° C. The device of the eleventh embodiment exhibits better tradeoff characteristics than those of the EST-3 and IGBT due to the same reason described in relation to the eighth embodiment.

The device of the eleventh embodiment having a square, hexagonal, octagonal, circular or the other planar pattern exhibits better tradeoff characteristics than those of the EST's and IGBT.

Twelfth Embodiment

Figure 24:
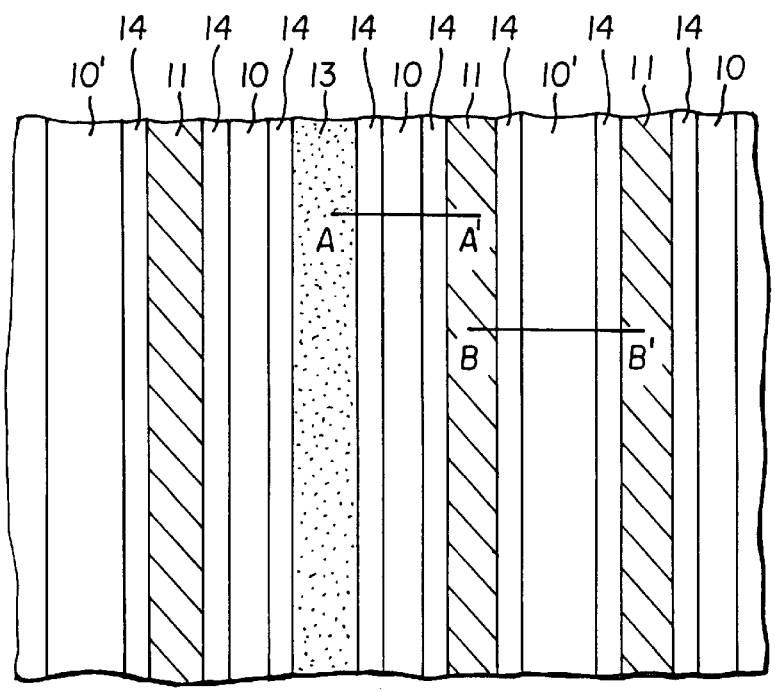
FIG. 24 is a plan view including a center of a gate electrode of an insulated gate thyristor of a twelfth embodiment according to the invention.

FIG. 24 is a plan view including a center of a gate electrode 10 of an insulated gate thyristor of a twelfth embodiment according to the invention. Referring now to FIG. 24, a cathode 11, gate electrodes 10, 10', polycrystalline silicon film 13 and insulation film 14 are arranged in stripes. A first p-type base region, second p-type base region, n-type source region and n-type emitter region are also arranged in stripes below the planar pattern of FIG. 24. In this figure, the gate electrode 10 with cathode 11 and polycrystalline silicon film 13 on both sides thereof and the gate electrode 10' with cathodes 11, 11 on both sides thereof coexist.

Figure 26A:
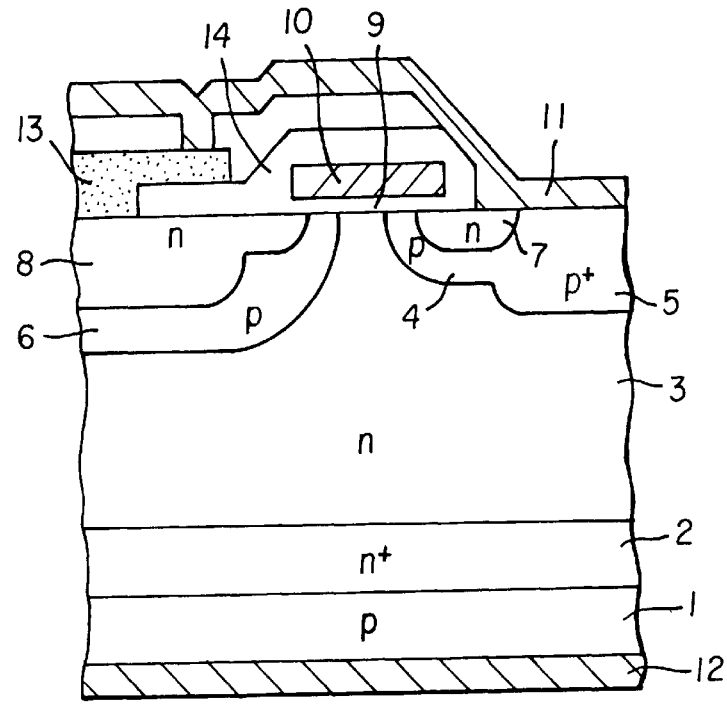
FIG. 26(a) is a cross section along A—A connecting the polycrystalline silicon film and cathode of FIG. 24.
Figure 26B:
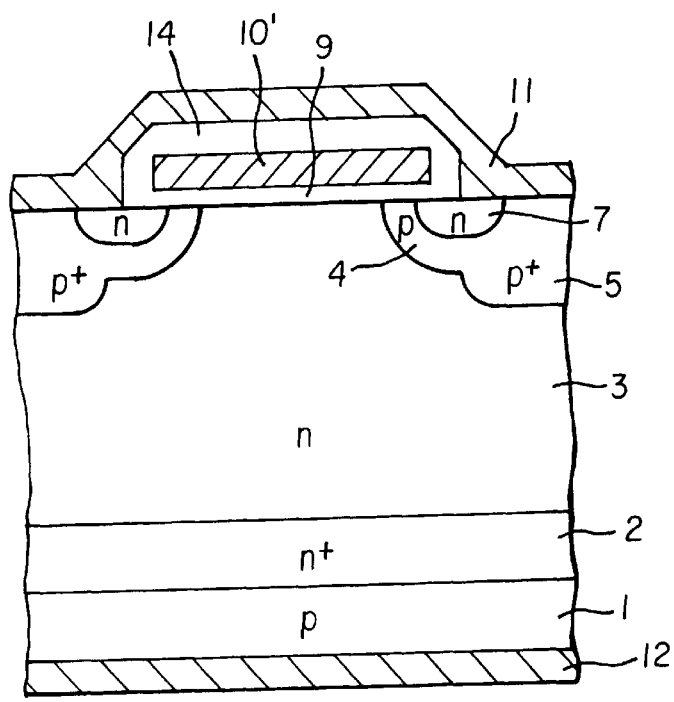
FIG. 26(b) is a cross section along B—B connecting the cathodes of FIG. 24.

FIG. 26(a) is a cross section along A—A' connecting the polycrystalline silicon film 13 and cathode 11 of FIG. 24. FIG. 26(b) is a cross section along B—B' connecting the cathodes 11, 11 of FIG. 24. Polycrystalline silicon film 13 is on an n-type emitter region 8. Cathode 11 is on a stripe-shaped n-type source region 7. Gate electrode 10 between cathode 11 and polycrystalline silicon film 13 is narrow and gate electrode 10' between cathodes 11, 11 is wide. For example, gate electrode 10 in FIG. 26(a) is 15 μm in width and gate electrode 10' in FIG. 26(b) is 30 μm in width.

The insulated gate thyristor of FIG. 24 can be manufactured through the similar process for manufacturing the IGBT simply by changing the masks for forming the diffusion regions.

Thirteenth Embodiment

Figure 25:
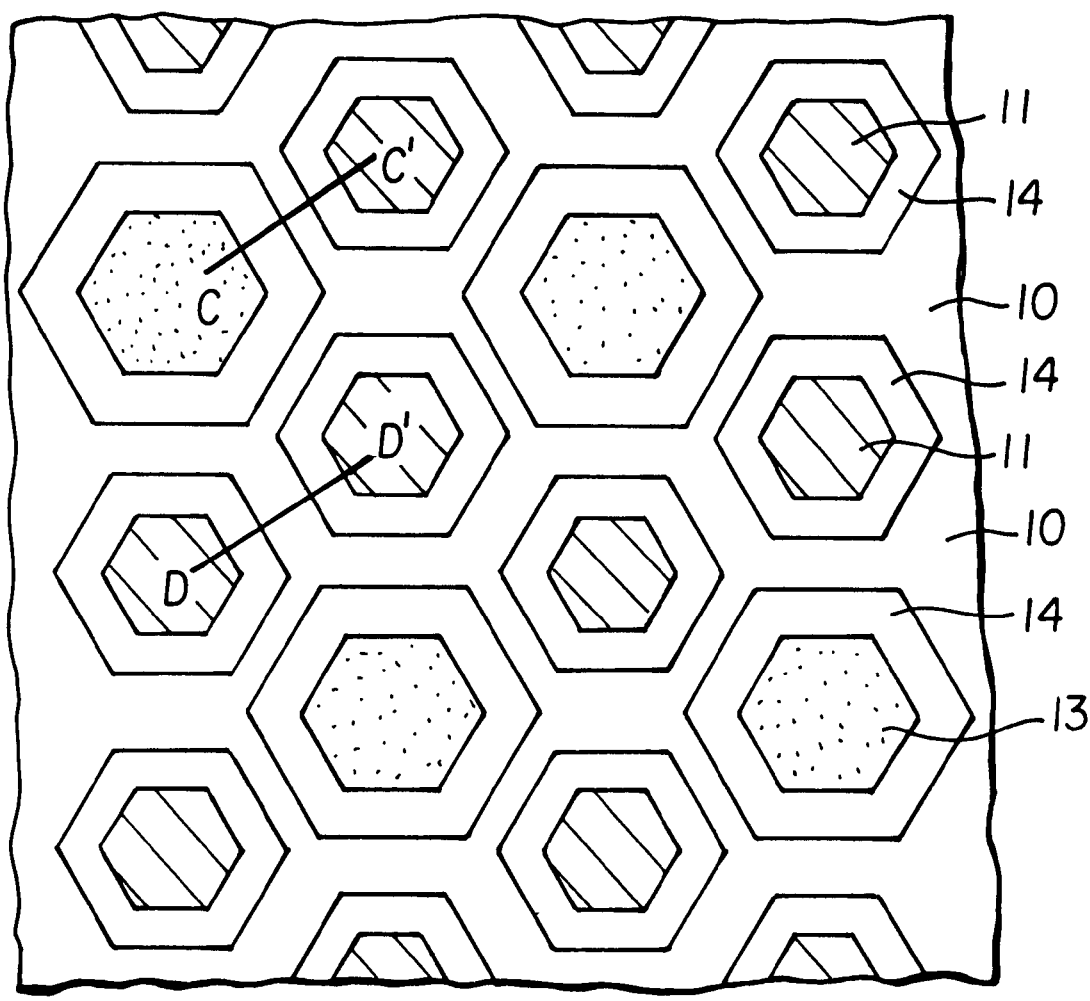
FIG. 25 is a plan view including a center of a gate electrode of an insulated gate thyristor of a thirteenth embodiment according to the invention.

FIG. 25 is a plan view including a center of a gate electrode of an insulated gate thyristor of a thirteenth embodiment according to the invention. Referring now to FIG. 25, a hexagonal annular insulation film 14 is around a hexagonal polycrystalline silicon film 13. Gate electrode 10 extends around insulation 14. On the other side of gate electrode 10, a hexagonal cathode 11 is arranged with insulation film 14 interposed between cathode 11 and gate electrode 10. Six hexagonal cathodes 11 are arranged around hexagonal polycrystalline silicon film 13 such that the cell pattern is repeated two-dimensionally. An n-type emitter region 8 and a second p-type base region 6 are under polycrystalline silicon film 13. An n-type source region 7 and a first p-type base region 4 are under cathode 11. On the plane of the figure, gate electrode 10 between cathode 11 and polycrystalline silicon film 13 is narrow and gate electrode 10' between cathodes 11, 11 is wide. The cross section along C—C' connecting cathode 11 and polycrystalline silicon film 13 is almost similar to FIG. 26(a), and the cross section along D—D' connecting cathodes 11, 11 is almost similar to FIG. 26(b).

Thus, n-type base layer 3 is narrow between n-type emitter region 8 and n-type base region 7 and wide between n-type base regions 7, 7.

Figure 27:
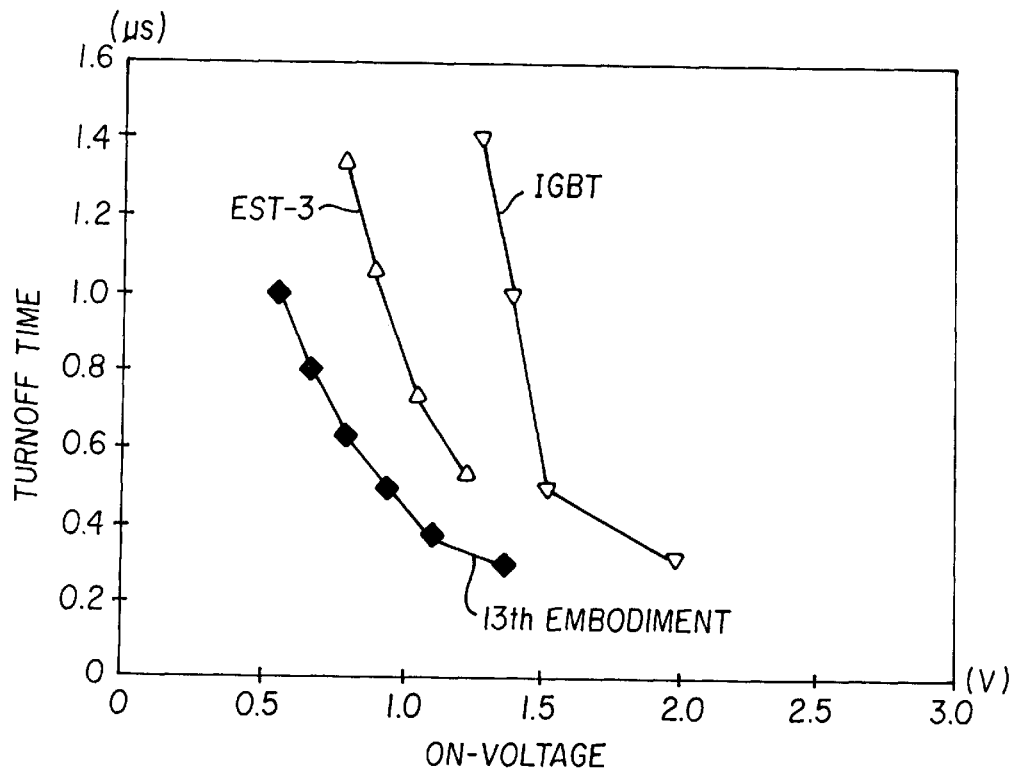
FIG. 27 is a set of curves comparing the tradeoff characteristics between the on-voltage and turnoff time of the device of the thirteenth embodiment with those of the comparative IGBT and EST-3.

FIG. 27 is a set of curves comparing the tradeoff characteristics between the on-voltage and turnoff time of the device of the thirteenth embodiment with those of the comparative IGBT and EST-3. In FIG. 27, the axis of abscissas represents the on-voltage and the axis of ordinates the turnoff time. The on-voltage is represented by the potential drop under the conduction of a current of 100

A/cm² at 25° C. The turnoff time was measured at 125° C. The carrier lifetime of the insulated gate thyristor of the thirteenth embodiment has been controlled by proton irradiation.

As can be seen from FIG. 27, the insulated gate thyristor of the thirteenth embodiment exhibits better tradeoff characteristics than those of the comparative IGBT and EST-3. The reason is as follows. Since n-type base layer 3 is narrow between n-type emitter region 8 and n-type source region 7, the resistance of the storage layer is low when the MOSFET is working, and the on-voltage is lowered. And, since n-type base layer 3 is wide between n-type source regions 7, 7, the junction FET (JFET) is ineffective at the early stage of turning-on and electrons are supplied quickly through the channel region. Moreover, the breakdown voltage characteristics is improved, the carriers are swept out quickly at turning-off, and switching is performed at high speed, since n-type emitter region 8 contacts with cathode 11 via polycrystalline silicon film 13. Therefore, the insulated gate thyristor of the thirteenth embodiment exhibits a wide safe operation area, turns off in a short time and is capable of controlling a large current.

In the device of the thirteenth embodiment, crystal defects which work as the lifetime killers were localized near n⁺ buffer layer 2 by irradiating protons from the side of anode 12 to optimize the distribution of the lifetime killers. By optimizing the lifetime killer distribution, lifetime killer generation in the unwanted portions is prevented and the on-voltage rise by the unnecessary lifetime killers is avoided.

An experimental device, the carrier lifetime of which has been controlled by helium ion implantation, exhibits almost the same characteristics with those of the device of the thirteenth embodiment, the carrier lifetime of which has been controlled by proton irradiation.

Fourteenth Embodiment

The device of the thirteenth embodiment includes an n⁺ buffer layer 2 between p-type emitter layer 1 and n-type base layer 3. However, the present invention is also applicable to an insulated gate thyristor which lacks n⁺ buffer layer 2. An insulated gate thyristor of a fourteenth embodiment of the invention has the same structures as illustrated in FIGS. 26(a) and 26(b) on a first major surface of an n-type base layer 3 of a bulk silicon wafer. However, a p-type emitter layer is formed directly onto a second major surface of n-type base layer 3. A polycrystalline silicon film 13 is formed on an n-type emitter layer 8. The carrier lifetime of the device of the fourteenth embodiment has been controlled by proton irradiation. The n-type base layer 3 is 440 $\mu$m in thickness.

The reverse bias safe operation area (RBSOA) of the 2500 V-class device of the fourteenth embodiment was measured at 125° C. with the circuit of FIG. 5. The result is almost the same with that of the insulated gate thyristor of the seventh embodiment of FIG. 13. The on-voltage in conducting a current of 50 A/cm² through the device of the fourteenth embodiment is 1.0 V. The 2500 V-class device of the invention which uses a bulk wafer exhibits, as the 600 V-class on the epitaxial wafer does, a much wider RBSOA and lower on-voltage as compared with the EST's and IGBT.

Figure 28:
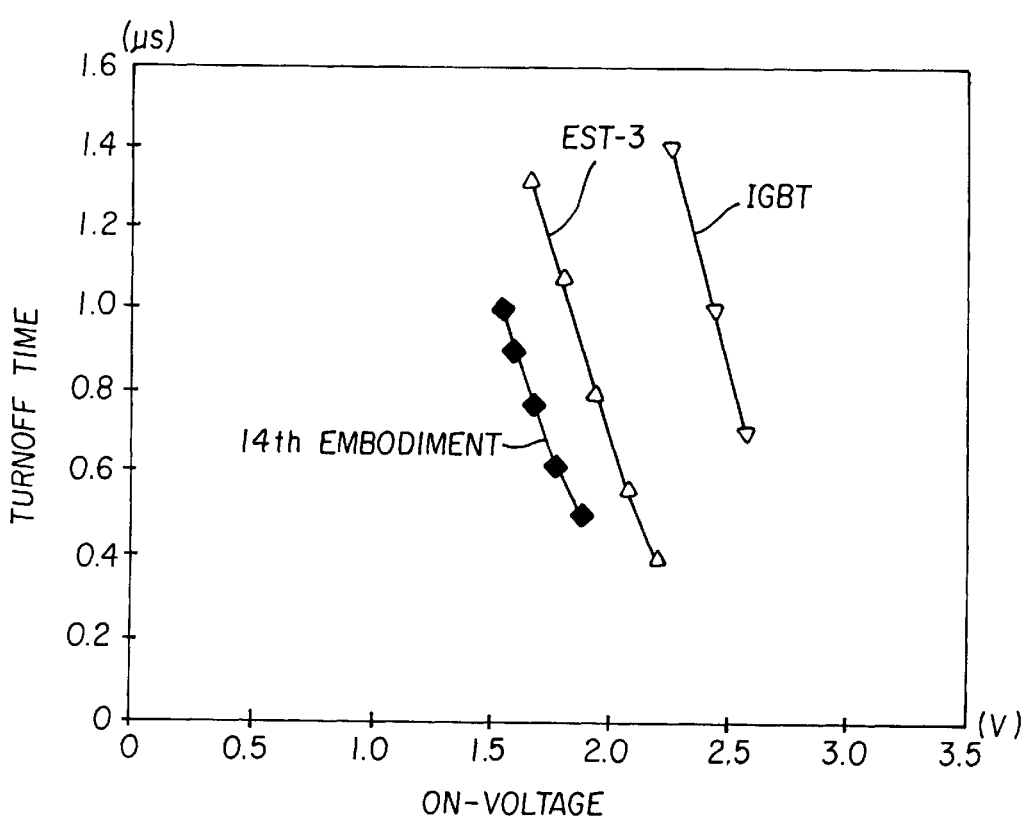
FIG. 28 is a set of curves comparing the tradeoff characteristics between the on-voltage and turnoff time of the 2500 V-class device of the fourteenth embodiment with those of the comparative 2500 V-class IGBT and EST-3.

FIG. 28 is a set of curves comparing the tradeoff characteristics between the on-voltage and turnoff time of the 2500 V-class device of the fourteenth embodiment with those of the comparative 2500 V-class IGBT and EST-3. In FIG. 28, the axis of abscissas represents the on-voltage and the axis of ordinates the turnoff time. The on-voltage is represented by the potential drop under the conduction of a current of 50 A/cm² at 25° C. The turnoff time was measured at 125° C. The device of the fourteenth embodiment exhibits better tradeoff characteristics than those of the EST-3 and IGBT. Due to the same reason described in relation to the twelfth embodiment, the insulated gate thyristor of the fourteenth embodiment facilitates operating in a wide safe area, turning-off in a short time and controlling a large current.

An experimental device, the carrier lifetime of which has been controlled by helium ion implantation, exhibits almost the same characteristics with those of the device of the fourteenth embodiment, the carrier lifetime of which has been controlled by proton irradiation.

Fifteenth Embodiment

Figure 29:
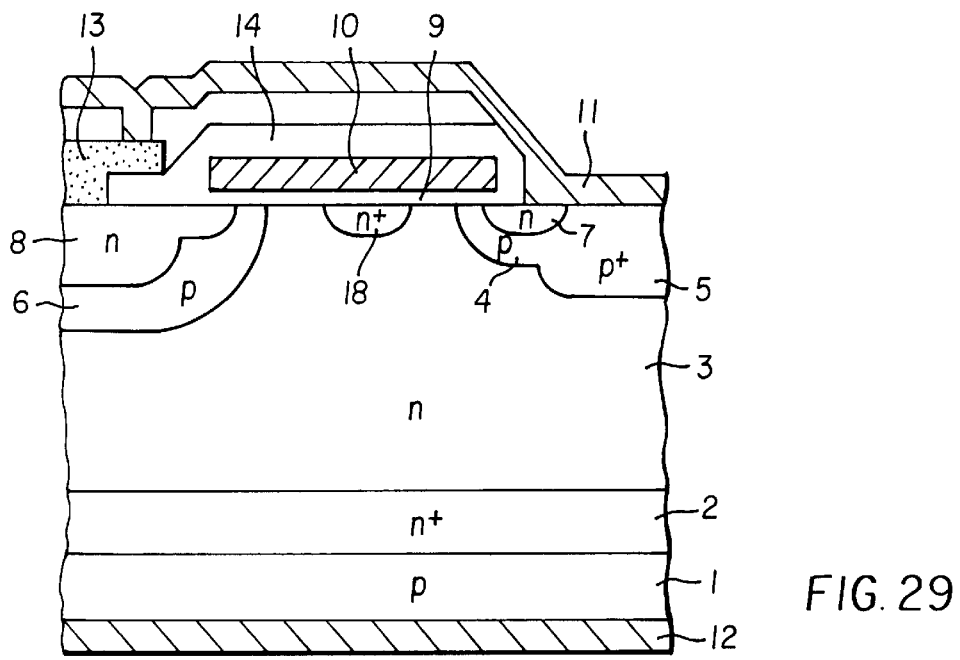
FIG. 29 is a cross section of a part of an insulated gate thyristor of a fifteenth embodiment according to the invention.

FIG. 29 is a cross section of a part of an insulated gate thyristor of a fifteenth embodiment according to the invention.

Referring now to FIG. 29, the device of the fifteenth embodiment is different from the device of the first embodiment of FIG. 1 in that an n⁺ auxiliary region 18, more heavily doped than an n-type base layer 3, is formed in the surface portion of n-type base layer 3 under a gate oxide film 9. In the insulated gate thyristor of the fifteenth embodiment, a second p-type base region 6 and n-type emitter region 8 are covered with an insulation film 14, and p-type base region 6 is not in contact with cathode 11. The width of n-type base layer 3 between the second p-type base region 6 and first p-type base region 4 is 20 $\mu$m. The surface impurity concentration of n⁺ auxiliary region 18 is $3\times10^{17}$ cm⁻³. The n⁺ auxiliary region 18 is 0.4 $\mu$m in diffusion depth and 10 $\mu$m in width.

Figure 30:
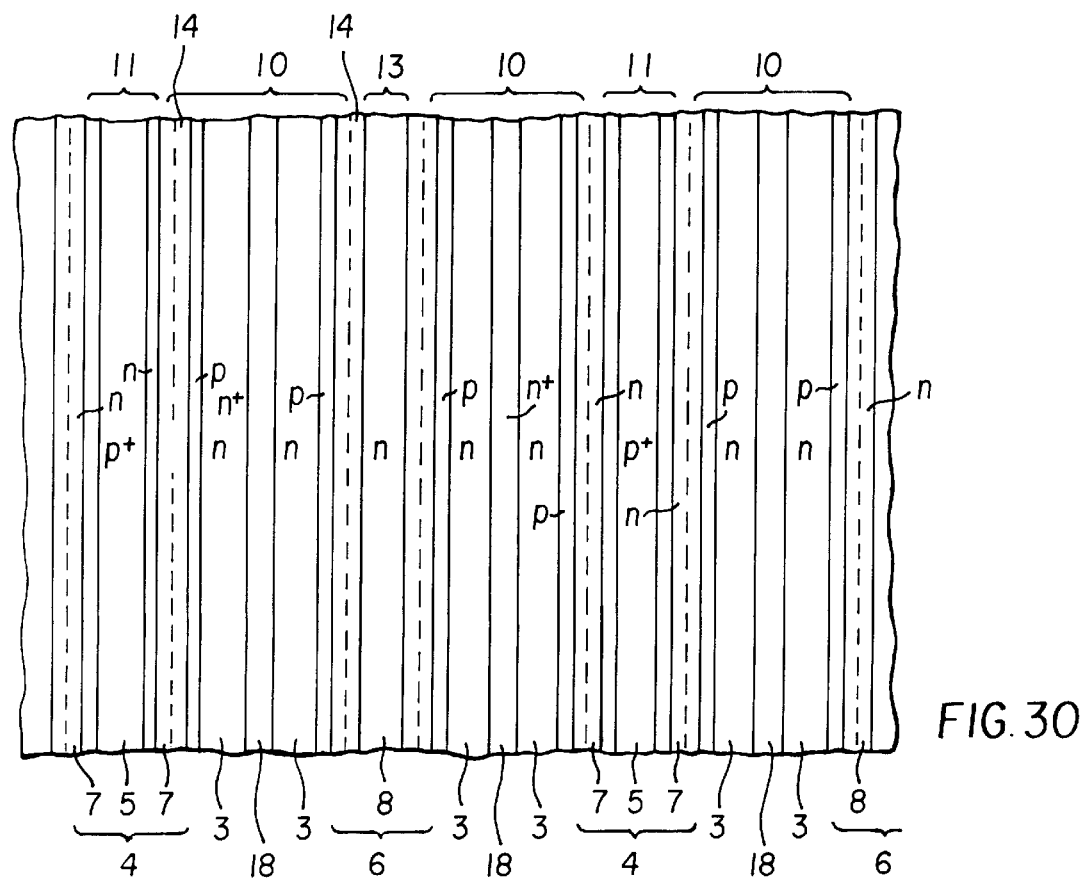
FIG. 30 is a planar pattern on a part of the silicon substrate surface looked through a gate electrode of the device containing a plurality of the cell of FIG. 29.

FIG. 30 is a planar pattern on a part of the silicon substrate surface looked through a gate electrode 10 of the device containing a plurality of the cell of FIG. 29. In FIG. 30, like parts with those of FIG. 29 are designated by the like reference numerals. The stripe-shaped n-type emitter region 8 and the stripe shaped n-type source region 7 are arranged in parallel. The stripe-shaped n⁺ auxiliary region 18 is in the surface portion of n-type base layer 3 extended between n-type emitter region 8 and n-type source region 7. A p⁺ well region 5 is between n-type source regions 7, 7. Though not shown in the figure, the fist p-type base region is outside n-type source regions 7, and the second p-type base region outside n-type emitter region 8. The edge of gate electrode 10 is indicated by a dotted line. The edge belongs to gate electrode 10 on a thin gate oxide film 9 and excludes the portion extended over a thick insulation film 14.

The device of the fifteenth embodiment dose not need any hole current flowing in the second p-type base region in Z-direction, and quickly shifts from the IGBT mode to the thyristor mode. Since electrons are injected uniformly from entire n-type emitter region 8, the on-voltage is lowered. Since the pn junction between n-type emitter region 8 and p-type base region 6 recovers uniformly by the potential difference in turning-off, the current localization is avoided and the RBSOA of the insulated gate thyristor of the fifteenth embodiment is drastically widened.

A 1200 V-class device of the fifteenth embodiment to be measured was fabricated on a wafer consisting of an epitaxially grown p-type layer 1 of 0.02 $\Omega$.cm in resistivity and 450 $\mu$m in thickness; an epitaxially grown n⁺ buffer layer 2 of 0.03 $\Omega$.cm in resistivity and 5 $\mu$m in thickness; and an epitaxially grown n-type base layer 3 of 80 $\Omega$.cm in resistivity and 115 $\mu$m in thickness. The n-type source region was 4 $\mu$m in thickness. The chip size was 0.64 cm². The maximum controllable current of the device of the fifteenth embodiment is doubled and the on-voltage thereof is lowered as compared with those of the devices which lack n⁺ auxiliary region 18, since the p-channel is hardly created under the gate oxide film in turning-off and the channel resistance is lowered in the device of the fifteenth embodiment.

Sixteenth Embodiment

Figure 31:
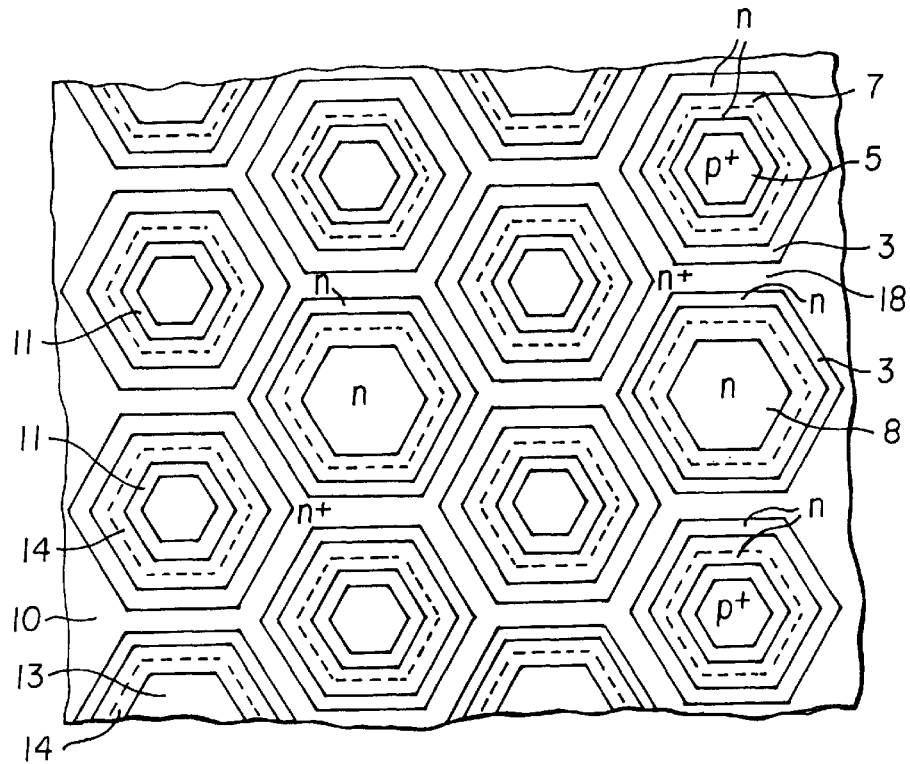
FIG. 31 is a planar pattern including a plurality of cells on a part of the silicon substrate surface looked through a gate electrode of an insulated gate thyristor of a sixteenth embodiment.

Influences of the planar pattern difference to the characteristics of the insulated gate thyristor have been investigated. FIG. 31 is a planar pattern including a plurality of cells on a part of the silicon substrate surface looked through a gate electrode of an insulated gate thyristor of a sixteenth embodiment. It has been found that the device of the sixteenth embodiment having hexagonal cells illustrated in FIG. 31 exhibits a larger maximum controllable current and lower on-voltage than those of the device of the fifteenth embodiment. This may be attributed to the differences in the total channel length in a portion along which a p-type base region 6 and an n-type emitter region 8 in the surface portion of p-type base region 6 are facing opposite to each other and a portion along which a p-type base region 4 and an n-type source region 7 in the surface portion of p-type base region 4 are facing opposite to each other, and to the difference in the JFET effect.

The insulated gate thyristors, having the other planar patterns such as those of the second through sixth embodiments, octagonal pattern, dodecagonal pattern and elliptic pattern, and their 2500 V-class devices exhibit better tradeoff characteristics than those of the comparative EST's and IGBT.

Seventeenth Embodiment

Figure 32:
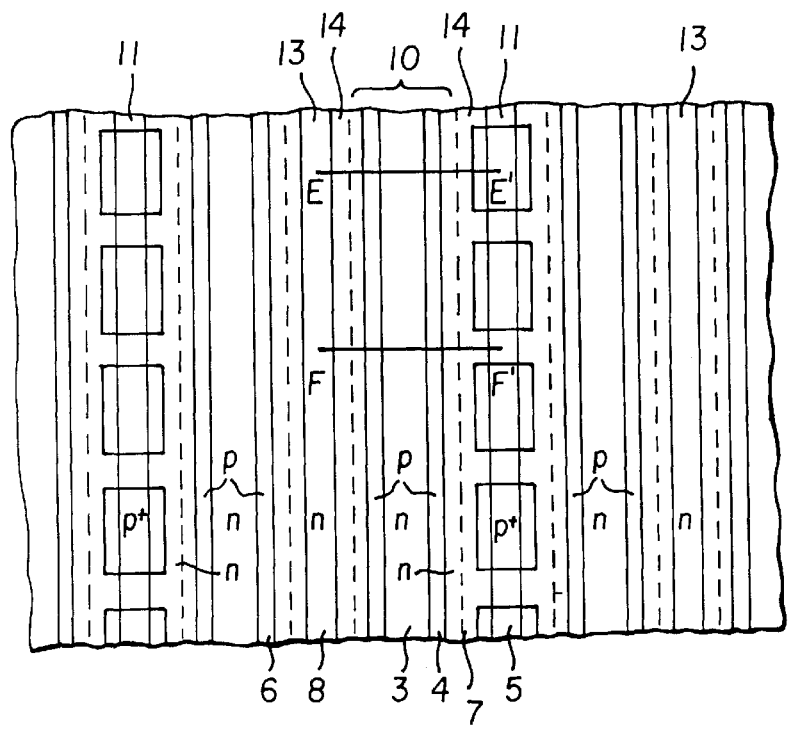
FIG. 32 is a planar pattern including a plurality of cells on a part of the silicon substrate surface looked through a gate electrode of an insulated gate thyristor of a seventeenth embodiment.

FIG. 32 is a planar pattern including a plurality of cells on a part of the silicon substrate surface looked through a gate electrode 10 of an insulated gate thyristor of a seventeenth embodiment. Both edges of gate electrode 10 (on a thin gate oxide film) are indicated by fine dotted lines. A stripe-shaped first p-type base region 4 and a second p-type base region 6, both indicated by bold solid lines, are facing opposite to each other. A stripe-shaped n-type emitter region 8 is inside p-type base region 6. A stripe-shaped n-type source region 7, having rectangular windows therein, is inside p-type base region 4. A p⁺ well region 5 is in the rectangular window of n-type source region 7. Both edges of a cathode 11 in contact with the surfaces of n-type source region 7 and p⁺ well region 5 are indicated by fine solid lines. Both edges of a polycrystalline silicon film 13 in contact with n-type emitter region 8 are indicated also by fine solid lines.

FIG. 34(*a*) is a cross section along E—E' of FIG. 32, and FIG. 34(*b*) is a cross section along F—F' of FIG. 32. In FIG. 34(*a*), the surface of n-type source region 7 is covered with an insulation film and not in contact with cathode 11. In FIG. 34(*b*), the surface of n-type source region 7 is in contact with cathode 11. Polycrystalline silicon film 13 is in contact with the surface of n-type emitter region 8.

Operation of the device of the seventeenth embodiment will be explained later.

Eighteenth Embodiment

Figure 33:
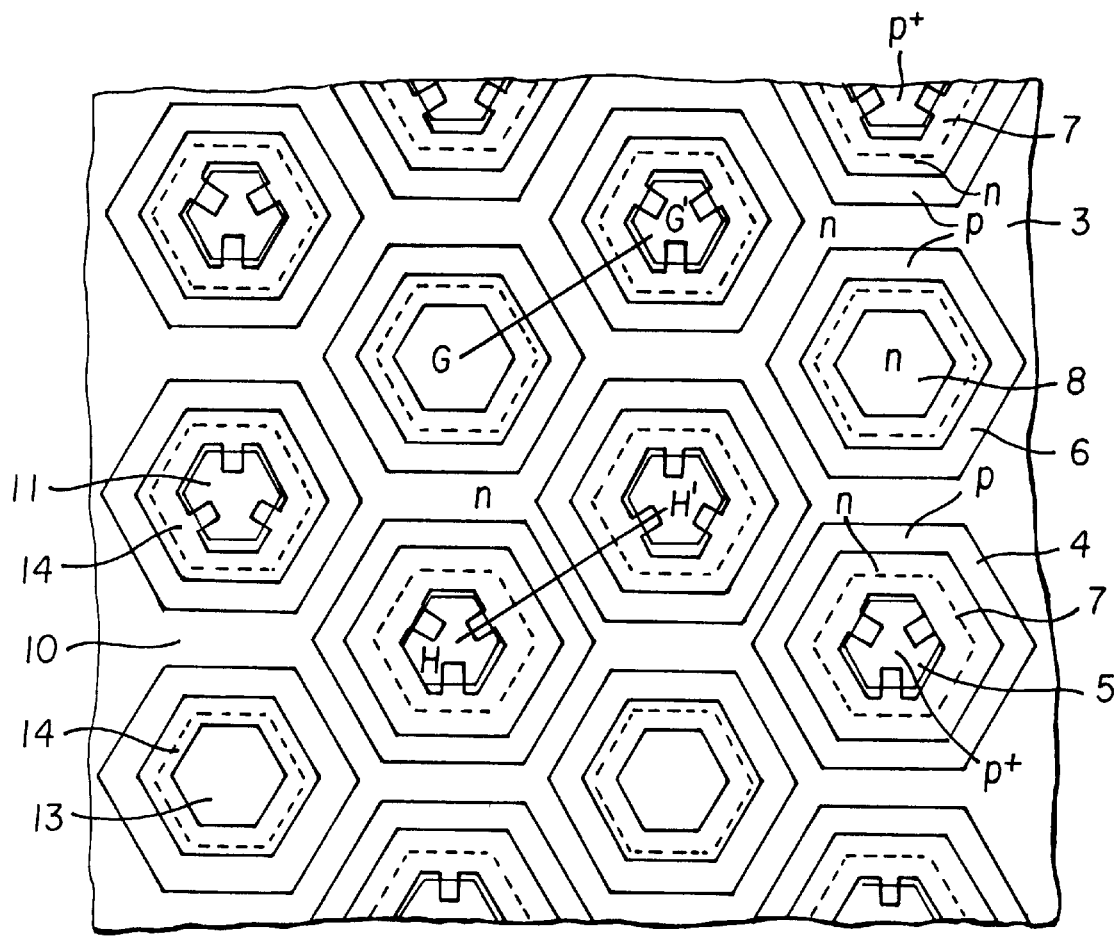
FIG. 33 is a planar pattern including a plurality of cells on a part of the silicon substrate surface looked through a gate electrode of an insulated gate thyristor of a eighteenth embodiment.

FIG. 33 is a planar pattern including a plurality of cells on a part of the silicon substrate surface looked through a gate electrode 10 of an insulated gate thyristor of a eighteenth embodiment. An edge of gate electrode 10 is indicated by dotted lines. A planar pattern including six hexagonal first p-type base regions 4 arranged around a hexagonal second p-type base region 6 is repeated two-dimensionally. A hexagonal n-type emitter region 8 is in the second p-type base region 6. A hexagonal annular n-type source region 7 is in the first p-type base region 4. Three protrusions are inside n-type source region 7. A p⁺ well region 5 is inside the protrusions. A fine solid line in n-type emitter region 8 indicates an edge (contact portion) of a polycrystalline silicon film 13, and a fine solid line in n-type source region 7 indicates an edge (contact portion) of a cathode 11. A cross section along G—G' of FIG. 33 connecting n-type emitter region 8 and n-type source region 7 is almost the same with FIG. 34(*a*), and a cross section along H—H' of FIG. 33 connecting n-type source regions 7, 7 is almost the same with FIG. 34(*b*).

In the cross section along G—G' of FIG. 33 (same with FIG. 34(*a*)), the surface of n-type source region 7 is covered with an insulation film and not in contact with cathode 11.

In the cross section along H—H' of FIG. 33 (same with FIG. 34(*b*)), cathode 11 contacts commonly with the surfaces of the first p-type base region 4 and n-type source region 7, in the similar manner as in the first embodiment.

The insulated gate thyristor of FIG. 33 is manufactured through almost the same process with that of the insulated gate bipolar transistor simply by changing the masks for forming the diffusion regions. The carrier lifetime of the device of FIG. 33 is controlled by proton irradiation under the conditions mentioned earlier.

Since the thus formed insulated gate thyristor operates in the same manner as the device of the first embodiment, explanation on the operation of the device of the eighteenth embodiment will be omitted. In the insulated gate thyristor of the eighteenth embodiment, the first p-type base region 6 is diffused more deeply than the first p-type base region 4, and n-type emitter region 8 is diffused more deeply than n-type source region 7. Due to the differences of the diffusion depth, the current amplification of the npn transistor in the thyristor portion is increased and the on-voltage is lowered. However, the portion of n-type emitter region 8 near p-type base region 4 is formed in almost the same dimensions with those of n-type source region 7 considering the breakdown voltage.

Since the insulated gate thyristor having the planar pattern of FIG. 33 includes, on n-type emitter region 8, polycrystalline silicon film 13 connected to cathode 11 as shown in FIG. 34(*a*), the thyristor portion consisting of n-type emitter region 8, the second p-type base region 6, n-type base layer 3 and p-type emitter layer 1 turns on and off uniformly. Therefore, the insulated gate thyristor of the eighteenth embodiment realizes fast switching speed and wide RBSOA. Since the surface of n-type source region 7, in the first p-type base region 4 and nearest to the second p-type base region 6 and n-type emitter region 8, is covered with insulation film 14 and not in contact with cathode 11, a current flows from n-type emitter region 8 in the thyristor portion to n-type source region 7 via the inversion layer beneath gate electrode 10. When the current flows, however, the parasitic thyristor consisting of n-type source region 7, p-type base region 4, n-type base layer 3 and p-type emitter layer 1 is hardly latched up, since n-type source region 7 near p-type base region 6 is not electrically connected with cathode 11. Therefore, elongation of the turnoff time, caused in the conventional devices by electron injection from n-type source region 7, is not caused in the device of the eighteenth embodiment and the turnoff time thereof is shortened.

Though n-type source region 7 contacts with cathode 11 in the portion where n-type source regions 7, 7 are facing opposite to each other as shown in FIG. 34(*b*), the heavily doped p⁺ well region 5 disposed under the first p-type base region 4 suppresses the latch-up in this portion.

Figure 35:
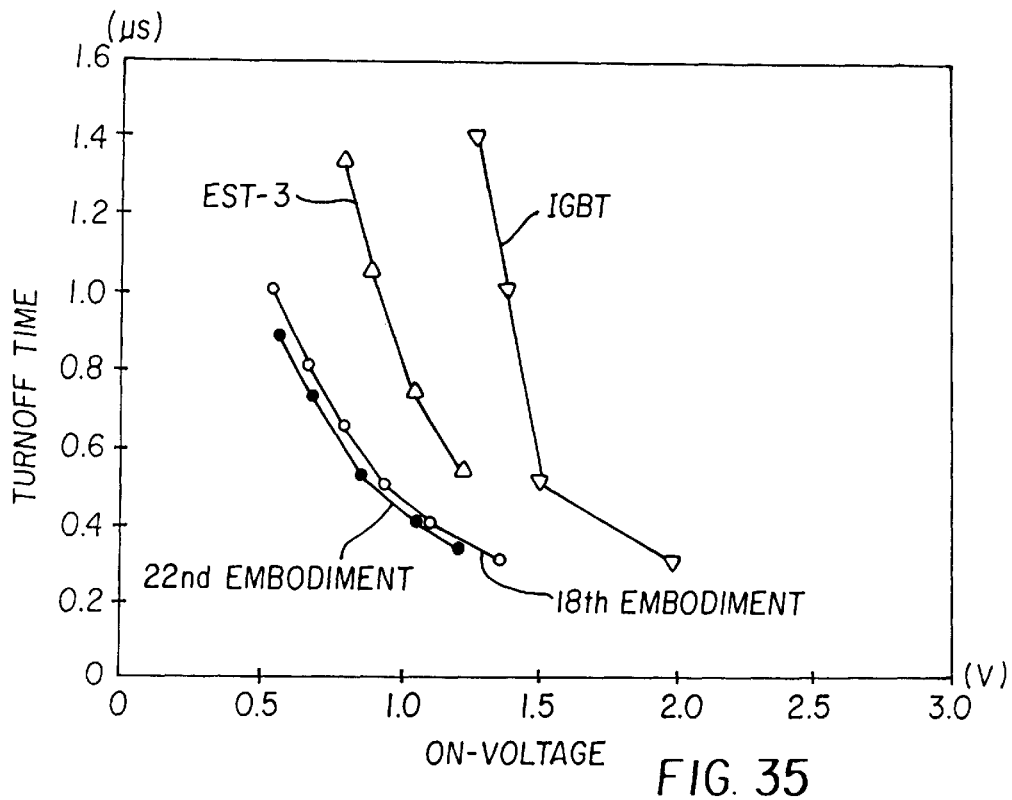
FIG. 35 is a set of curves comparing the tradeoff characteristics between on-voltage and turnoff time of the devices of the eighteenth and twenty second embodiments, IGBT and EST-3.

FIG. 35 is a set of curves showing the tradeoff characteristics between on-voltage and turnoff time of the device of FIG. 33, IGBT and EST-3. The EST-3 has been picked up as the representative of the comparative EST's since the EST-3 exhibits, though the breakdown voltage thereof is low, the most excellent tradeoff characteristics among the EST's. In FIG. 35, the axis of abscissas represents the on-voltage and the axis of ordinates the turnoff time. The on-voltage is represented by the potential drop under the conduction of a current of 100 A/cm$^2$ at 25° C. The turnoff time was measured at 125° C. The devices subject to the measurement was of 600 V-class. The n-type source region 7 of the insulated gate thyristor subject to the measurement is 4 μm in width. The n-type emitter region of the EST-3 subject to the measurement is 20 μm in width. The chip size is 1 cm$^2$ for all the devices subject to the measurement. The carrier lifetime of the insulated gate thyristor of the eighteenth embodiment has been controlled by proton irradiation.

As can be seen from FIG. 35, the insulated gate thyristor of the eighteenth embodiment exhibits better tradeoff characteristics than those of the comparative IGBT and EST-3.

The is due to that the parasitic thyristor is prevented from latching up by covering the surface of n-type source region 7 near the second p-type base region 6 with an insulation film. Moreover, by making n-type emitter region 8 contact with cathode 11 via polycrystalline silicon film 13, the breakdown voltage characteristics of the device of the eighteenth embodiment is improved, the carriers are swept out quickly at turning-off and high speed switching is realized.

In the device of the eighteenth embodiment, crystal defects which work as the lifetime killers were localized by proton irradiation to optimize the distribution of the lifetime killers. By optimizing the lifetime killer distribution, lifetime killer generation in the unwanted portions is prevented and the tradeoff characteristics between on-voltage and turnoff time is further improved.

The reverse bias safe operation area (RBSOA) of the device of the eighteenth embodiment with the planar pattern of FIG. 33 and with the controlled carrier lifetime by proton irradiation was measured at 125° C. with the circuit of FIG. 5. The result is almost the same with that of the insulated gate thyristor of the seventh embodiment of FIG. 13. The on-voltage in conducting a current of 50 A/cm$^2$ through the device of the fourteenth embodiment is 0.9 V. The device of the eighteenth embodiment exhibits a much wider RBSOA and lower on-voltage as compared with the EST's and IGBT. This is due to that the current localization is avoided by shaping n-type emitter region 8 and p-type base region 6 with polygons and by arranging a plurality of p-type base regions 4 around n-type emitter region 8 and p-type base region 6.

An experimental device, the carrier lifetime of which has been controlled by helium ion implantation, exhibits almost the same characteristics with those of the device of the eighteenth embodiment, the carrier lifetime of which has been controlled by proton irradiation.

Nineteenth Embodiment

Figure 34A:
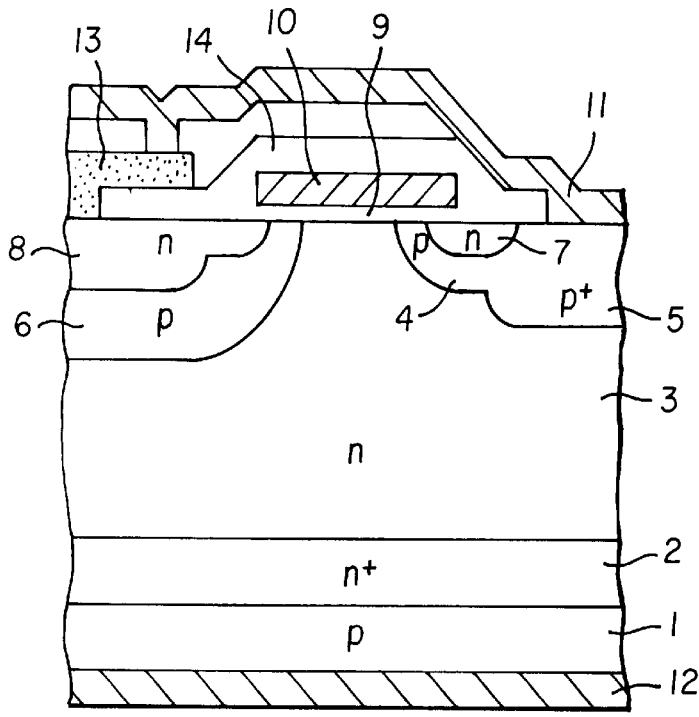
FIG. 34(a) is a cross section along E—E' of FIG. 32.
Figure 34B:
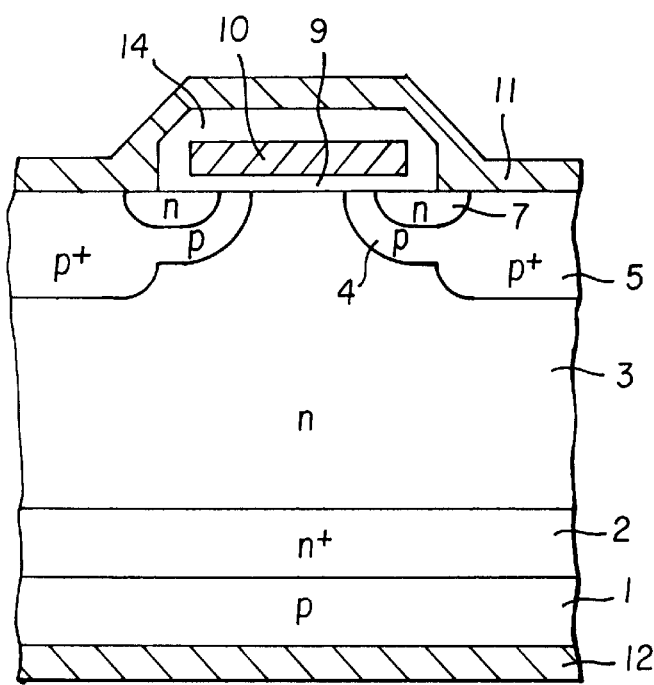
FIG. 34(b) is a cross section along F—F' of FIG. 32.

The insulated gate thyristor with the same cross sections with those of FIGS. 34(a) and 34(b) has n$^+$ buffer layer 2 between p-type emitter layer 1 and n$^+$ buffer layer 2. The present invention is applicable also to the device which lacks n$^+$ buffer layer 2. An insulated gate thyristor of the nineteenth embodiment has the same structures with those of FIGS. 34(a) and 34(b) on a first major surface of an n-type base layer 3 in a bulk silicon wafer and a p-type emitter layer 1 formed directly on a second major surface of n-type base layer 3. A polycrystalline silicon film 13 is formed on the surface of an n-type emitter region 8. The n-type base layer 3 is 440 μm in thickness. The carrier lifetime of the device of the nineteenth embodiment has been controlled by proton irradiation.

Figure 36:
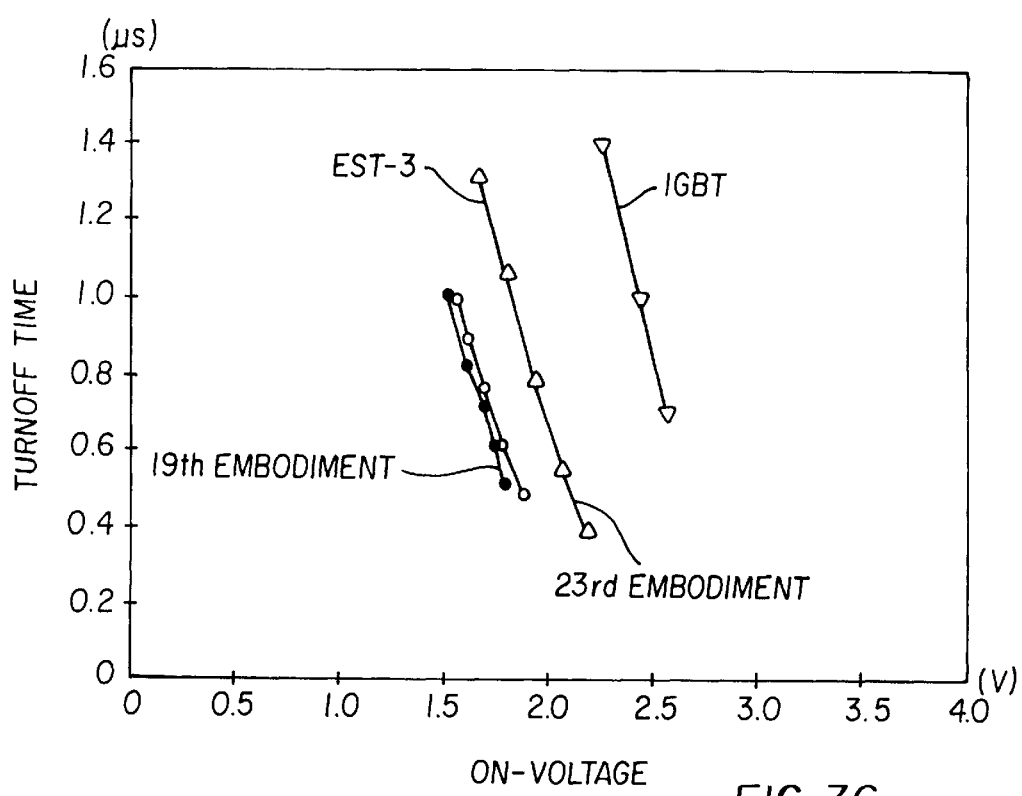
FIG. 36 is a set of curves comparing the tradeoff characteristics between the on-voltage and turnoff time of the 2500 V-class devices of the nineteenth and twenty third embodiments with those of the comparative 2500 V-class IGBT and EST-3.

FIG. 36 is a set of curves comparing the tradeoff characteristics between the on-voltage and turnoff time of the 2500 V-class device of the nineteenth embodiment with those of the comparative 2500 V-class IGBT and EST-3. In FIG. 36, the axis of abscissas represents the on-voltage and the axis of ordinates the turnoff time. The on-voltage is represented by the potential drop under the conduction of a current of 50 A/cm$^2$ at 25° C. The turnoff time was measured at 125° C. The device of the nineteenth embodiment exhibits better tradeoff characteristics than those of the EST-3 and IGBT due to the same reason described in relation to the eighteenth embodiment.

The reverse bias safe operation area (RBSOA) of the 2500 V-class device of the nineteenth embodiment, the carrier lifetime of which had been controlled by proton irradiation, was measured at 125° C. with the circuit of FIG. 5. The result is almost the same with that of the insulated gate thyristor of the seventh embodiment of FIG. 13. The on-voltage in conducting a current of 60 A/cm$^2$ through the device of the nineteenth embodiment is 1.1 V.

The 2500 V-class device of the invention which uses a bulk wafer exhibits, as the 600 V-class on the epitaxial wafer does, a much wider RBSOA and lower on-voltage as compared with the EST's and IGBT.

An experimental device, the carrier lifetime of which has been controlled by helium ion implantation, exhibits almost the same characteristics with those of the device of the nineteenth embodiment, the carrier lifetime of which has been controlled by proton irradiation.

Twentieth Embodiment

Figure 37:
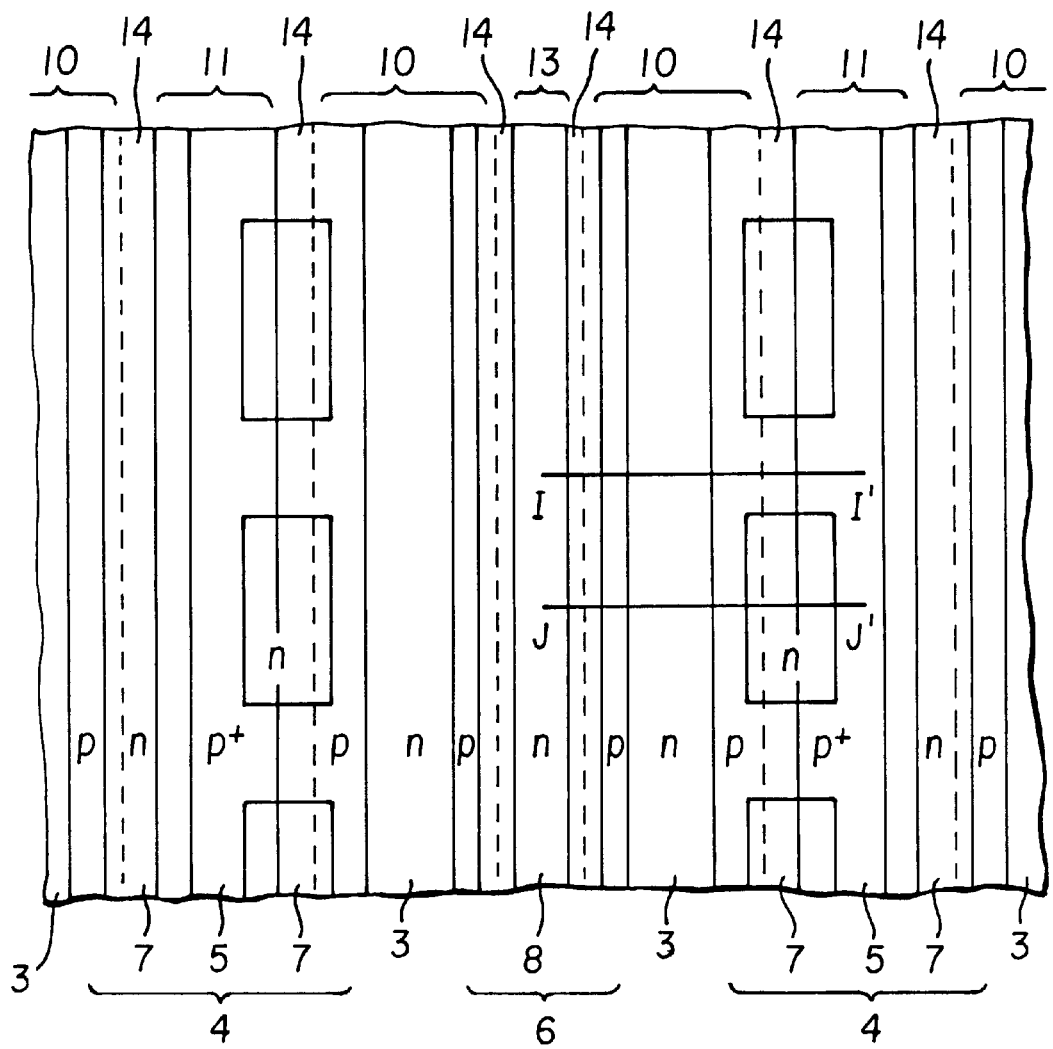
FIG. 37 is a planar pattern including a plurality of cells on a part of the silicon substrate surface looked through a gate electrode, insulation film and cathode of an insulated gate thyristor of a twentieth embodiment.

FIG. 37 is a planar pattern including a plurality of cells on a part of the silicon substrate surface looked through a gate electrode 10, insulation film 14 and cathode 11 of an insulated gate thyristor of a twentieth embodiment. Both edges of gate electrode 10 (on a thin gate oxide film) are indicated by fine dotted lines. Both edges of a cathode 11 are indicated by fine solid lines. A polycrystalline silicon film 13 connected to cathode 11 is formed on the surface of an n-type emitter layer 8. A stripe-shaped first p-type base region 4 and a stripe-shaped second p-type base region 6, both indicated by bold solid lines, are facing opposite to each other. The stripe-shaped n-type emitter region 8 is inside p-type base region 6. A stripe-shaped n-type source region 7 and rectangular n-type source regions 7 are inside p-type base region 4.

Figure 38A:
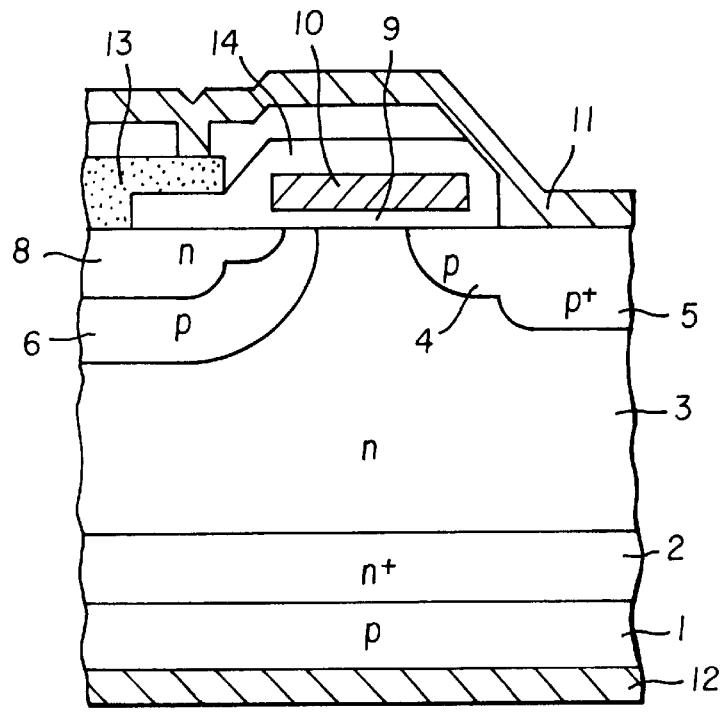
FIG. 38(a) is a cross section along I—I' of FIG. 37.
Figure 38B:
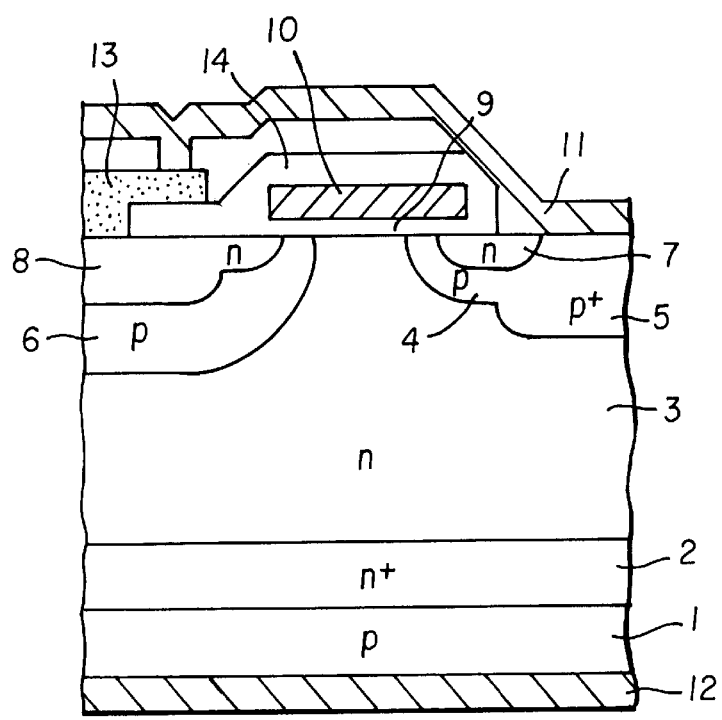
FIG. 38(b) is a cross section along J—J' of FIG. 37.

FIG. 38(a) is a cross section along I—I' of FIG. 37, and FIG. 38(b) is a cross section along J—J' of FIG. 37. The sectional structure shown in FIG. 38(b) is almost same with that of the first embodiment shown in FIG. 1. Therefore, the operation in the portion shown in FIG. 38(b) is same with that of the first embodiment of FIG. 1.

In the sectional structure along I—I' shown in FIG. 38(a), the n-type source region 7 is not formed in the surface portion of certain p-type base regions 4. Therefore, the latch-up withstand capability of the parasitic transistor increases, since, in this cross section, electrons are not fed from a cathode 11 to an n-type base layer 3 when a voltage is applied to a gate electrode 10, and the p-type base region 4 which lacks the n-type source region 7 functions as a hole for extracting the carriers at turning-off. Thus, the insulated gate thyristor of the twentieth embodiment operates in a wide safe area, turns off in a short time and controls a large current.

The insulated gate thyristor of the twentieth embodiment can be manufactured through the similar manufacturing process for the IGBT simply by changing the masks for forming the diffusion regions.

Twenty first Embodiment

Figure 39:
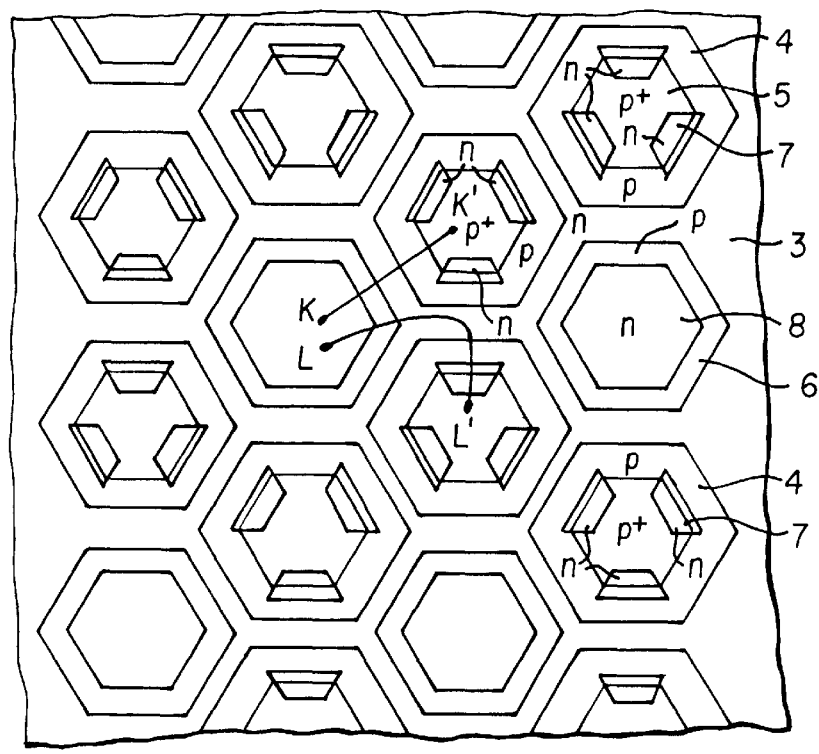
FIG. 39 shows diffusion regions of an insulated gate thyristor of a twenty first embodiment from which insulation films and electrodes are removed.

FIG. 39 shows diffusion regions of an insulated gate thyristor of a twenty first embodiment from which insulation films and electrodes are removed. A planar pattern including a hexagonal second p-type base region 6 and six hexagonal first p-type regions 4 around p-type base region 6 is repeated two-dimensionally. A hexagonal n-type emitter region 8 is in the surface portion of the second p-type base region 6. A trapezoidal n-type source region 7 is in the surface portion of the first p-type base region 4. A fine solid line in p-type base region 4 indicates the contact portion thereof with a cathode. The surfaces of p-type base region 6 and n-type emitter region 8 are covered with an insulation film and not in contact with cathode. The cross section along K—K' of FIG. 39 is same with FIG. 38(a), and the cross section along L—L' of the figure is same with FIG. 38(b). Thus, n-type source region 7 of the device with a polygonal cell pattern is divided to a plurality of regions to realize an insulated gate thyristor with a short turnoff time.

Twenty second Embodiment

Figure 40:
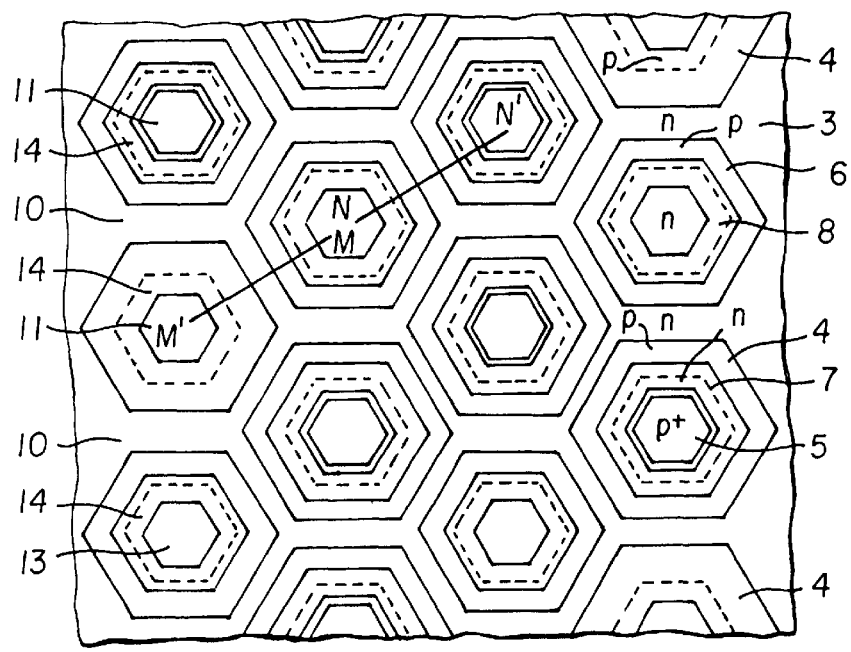
FIG. 40 shows diffusion regions seen through a gate electrode of an insulated gate thyristor of a twenty second embodiment from which insulation films and electrodes are removed.

FIG. 40 shows diffusion regions seen through a gate electrode 10 of an insulated gate thyristor of a twenty second embodiment from which insulation films and electrodes are removed. A planar pattern including a hexagonal second p-type base region 6 and six hexagonal first p-type regions 4 around p-type base region 6 is repeated two-dimensionally. A hexagonal annular n-type source region 7 is in the surface portion of the hexagonal first p-type base region 4. A hexagonal n-type emitter region 8 is in the surface portion of the second p-type base region 6. Some p-type base regions 4 do not have n-type source region 7 therein. A $p^+$ well region 5 is in the hexagonal annular n-type source region 7. An edge of gate electrode 10 is indicated by a dotted line. A fine solid line in n-type source region 7 indicates the contact portion thereof with a cathode 11. A fine solid line in n-type emitter region 8 indicates the contact portion thereof with a cathode 11. The cross section along M—M' of FIG. 40 is same with FIG. 38(a), and the cross section along N—N' of the figure is same with FIG. 38(b).

The insulated gate thyristor of the twenty second embodiment can be manufactured through the similar manufacturing process for the IGBT simply by changing the masks for forming the diffusion regions. An insulated gate thyristor of 600 V-class having n-type source region 7 of 4 $\mu$m in width was fabricated on an epitaxial wafer similar to those described before was fabricated. The carrier life time of the device of the twenty second embodiment was controlled by proton irradiation under the conditions described earlier. The on-voltage of the device is 0.9 V for the conduction current of 100 A/cm$^2$.

The reverse bias safe operation area of the experimental device is three times as large as that of the IGBT and twice as large as that of the EST-3 indicating large breakdown withstand capability of the device of the twenty second embodiment.

Since a polycrystalline silicon film 13 is connected to cathode 11 on n-type emitter region 8, the device of the twenty second embodiment dose not need any hole current flowing in the second p-type base region in Z-direction, and quickly shifts from the IGBT mode to the thyristor mode. Since electrons are injected uniformly from entire n-type emitter region 8, the on-voltage is lowered. The pn junction between n-type emitter region 8 and p-type base region 6 recovers uniformly by the potential difference in turning-off without causing any current localization.

The tradeoff characteristics between on-voltage and turn-off time of the device of the twenty second embodiment is described in FIG. 35. The conditions for the measurement were same with those for the other devices. The insulated gate thyristor of the twenty second embodiment exhibits better tradeoff characteristics than those of the IGBT and EST-3.

The portion of the first p-type base region 4, wherein n-type source region 7 is not formed, functions as a hole for extracting the carries at turning-off, and the latch-up withstand capability of the parasitic thyristor increases. Therefore, the insulated gate thyristor of the twenty second embodiment exhibits a wide reverse bias safe operation area, short turnoff time and large controllable current. By narrowing the width of gate electrode 10 on the portion of the first p-type base region 4 wherein n-type source region 7 is not formed, the contact area of p-type base region 4 and cathode 11 is widened and the carrier extraction effect is enhanced. Moreover, by making n-type emitter region 8 contact with cathode 11 via polycrystalline film 13, breakdown voltage characteristics is improved, carriers are swept out quickly and switching is sped up.

By controlling the carrier lifetime by proton irradiation to localize the crystal defects which work as lifetime killers and to optimize the lifetime killer distribution, a low on-voltage is obtained in the device of the twenty second embodiment.

An experimental device, the carrier life time of which has been controlled by helium ion implantation, exhibits almost the same characteristics with those of the device of the twenty second embodiment, the carrier life time of which has been controlled by proton irradiation.

Twenty third Embodiment

The insulated gate thyristor of the twenty second embodiment having the same cross sections with those of FIGS. 34(a) and 34(b) includes an n$^+$ buffer layer 2 between p-type emitter layer 1 and n$^+$ buffer layer 2. The present invention is applicable also to the device which lacks n$^+$ buffer layer 2. An insulated gate thyristor of the twenty third embodiment has the same structures with those of FIGS. 38(a) and 38(b) on a first major surface of an n-type base layer 3 in a bulk silicon wafer and a p-type emitter layer formed directly on a second major surface of n-type base layer 3. A polycrystalline silicon film 13 is formed on the surface of an n-type emitter region 8. The n-type base layer 3 is 440 $\mu$m in thickness. The carrier lifetime of the device of the twenty third embodiment has been controlled by proton irradiation.

The tradeoff characteristics between the on-voltage and turnoff time of the 2500 V-class device of the twenty third embodiment are shown in FIG. 36. The conditions for the measurement were same with those of the other embodiments. The device of the twenty third embodiment exhibits better tradeoff characteristics than those of the EST-3 and IGBT due to the same reason described in relation to the twenty second embodiment.

The reverse bias safe operation area (RBSOA) of the 2500 V-class device of the twenty third embodiment, the carrier lifetime of which had been controlled by proton irradiation, was measured at 125° C. with the circuit of FIG. 5. The result is almost the same with that of the insulated gate thyristor of the seventh embodiment. Since the portion of the first p-type base region 4 wherein n-type source region 7 is not formed functions as a hole for extracting the carriers at turning-off, the latch-up withstand capability of the parasitic thyristor is improved. The on-voltage defined by the voltage drop in conducting a current of 50 A/cm$^2$ is 1.1 V.

The 2500 V-class device of the invention which uses a bulk wafer exhibits, as the 600 V-class on the epitaxial wafer does, a much wider RBSOA and lower on-voltage as compared with the EST's and IGBT.

An experimental device, the carrier lifetime of which has been controlled by helium ion implantation, exhibits almost the same characteristics with those of the device of the twenty third embodiment, the carrier lifetime of which has been controlled by proton irradiation.

The present invention widens the RBSOA without impairing the on-voltage irrespective of the resistivity of the n-type base layer and the current amplification factor of the pnp wide base transistor. To say in other words, the present invention is effective for lowering the on-voltage and for widening the RBSOA irrespective of the rated voltage of the device and method of growing semiconductor crystals for the substrate.

Though the first conductivity type is n-type and the second conductivity type is p-type in the embodiments described above, the conductivity types may be interchangeable.

Effect of the Invention

The conventional EST obtains the potential drop for latching up the thyristor from the IGBT mode by a current flowing in Z-direction of the device. In contrast, the present invention covers the surface of the second base region of the second conductivity type with an insulation film and makes contact a resistor, e.g. polycrystalline silicon film, with the emitter region of the first conductivity type to bias the emitter region at the same potential with the cathode. The insulated gate thyristor of the invention having the above described specific structure utilizes the potential difference across the pn junction between the second base region of the second conductivity type and the emitter region of the first conductivity type to effectively make the pn junction recover uniformly in shifting to the thyristor mode and in turning-off and to effectively increase the controllable current.

The insulated gate thyristor of the invention facilitates shortening the turnoff time and improving the tradeoff characteristics.

The first and second base regions of the second conductivity type may be shaped with stripes facing opposite to each other, polygons, circles or ellipsoids. By surrounding the second base region of the second conductivity type by the first base region of the second conductivity type, current localization is prevented from causing and the tradeoff characteristics are improved. A plurality of the first base region of the second conductivity type may be arranged around the second base region of the second conductivity type. The trench gate structure including a gate electrode buried in a trench may be adopted.

The current localization is prevented from causing, the parasitic thyristor is prevented from operating at turnoff, the carriers are extracted efficiently and a short turnoff time is realized by changing the width of the gate electrode from spot to spot, by disposing a heavily doped auxiliary region in a part of the surface portion of the base layer of the first conductivity type, by dividing the source region of the first conductivity type under the edge of the gate electrode into a plurality of regions, by covering a part of the surface of the source region of the first conductivity type near the second base region of the second conductivity type with an insulation film and making the uncovered portion contact with the cathode, or by disposing the first base regions of the second conductivity type which lack the source region of the first conductivity type.

The insulated gate thyristor, the carrier lifetime thereof has been controlled by proton irradiation or by helium ion implantation, exhibits more excellent tradeoff characteristics.

As the results, a voltage driven insulated gate thyristor, which exhibits better tradeoff characteristics between the on-voltage and turnoff time than those of the EST's and IGBT, and a wide reverse bias safe operation area, is obtained in a wide breakdown voltage region of from 600 to 2500 V. Moreover, by combining the foregoing means according to the invention, an insulated gate thyristor which exhibits more excellent characteristics is obtained.

What is claimed is:

1. An insulated gate thyristor comprising:
   a highly resistive base layer of a first conductivity type;
   a first base region of a second conductivity type, said first base region being selectively formed in the surface portion on a first side of said base layer;
   a second base region of said second conductivity type, said second base region being selectively formed in the surface portion on said first side of said base layer;
   said first and second base regions being spaced from each other;
   a source region of said first conductivity type, said source region being selectively formed in the surface portion of said first base region;
   an emitter region of said first conductivity type, said emitter region being selectively formed in the surface portion of said second base region;
   a first insulation film on an extended portion of said base layer extended between said first and second base regions, an extended portion of said first base region extended between said source region and said extended portion of said base layer and an extended portion of said second base region extended between said emitter region and said extended portion of said base layer;
   a gate electrode on said first insulation film;
   a first main electrode commonly contacting with said extended portion of said first base region and said source region;
   an emitter layer of said second conductivity type, said emitter layer being on a second side of said base layer;
   a second main electrode contacting with said emitter layer;
   a second insulation film covering the entire surface of said second base region; and
   a resistor on said emitter region, said resistor being connected to said first main electrode.

2. The insulated gate thyristor according to claim 1, wherein said first and second base regions are shaped with stripes facing opposite to each other.

3. The insulated gate thyristor according to claim 1, wherein at least one of said first base region, said second base region, said emitter region and said source region is formed in a shape selected from the group consisting of a polygon, circle and ellipsoid.

4. The insulated gate thyristor according to claim 1, wherein said first base region is around said second base region.

5. The insulated gate thyristor according to claim 1, wherein said first base region is around said second base region, said gate electrode is annular around said second insulation film on said second base region, and said first main electrode is spaced from said second base region by said gate electrode and said second insulation film.

6. The insulated gate thyristor according to claim 1, wherein a plurality of said first base region is around said second base region.

7. The insulated gate thyristor according to claim 6, further comprising base regions of said second conductivity type, wherein said source region of said first conductivity type is not formed.

8. The insulated gate thyristor according to claim 7, wherein said gate electrode is wider on said first base regions, wherein said source region is formed, than on said base regions, wherein said source region is not formed.

9. The insulated gate thyristor according to claim 6, wherein the portion of said source region's surface near to said second base region is covered with said second insulation film, and said first main electrode contacts with the portion of said source region's surface far from said second base region.

10. The insulated gate thyristor according to claim 1, wherein a plurality of said first base regions is around said second base region, said gate electrode is annular around said second insulation film on said second base region, and said first main electrode is spaced from said second base region by said gate electrode and said second insulation film.

11. The insulated gate thyristor according to claim 10, further comprising base regions of said second conductivity type, wherein said source region of said first conductivity type is not formed.

12. The insulated gate thyristor according to claim 11, wherein said gate electrode is wider on said first base regions, wherein said source region is formed, than on said base regions, wherein said source region is not formed.

13. The insulated gate thyristor according to claim 10, wherein said annular gate electrode comprises a cut-out portion, through which adjacent pair of said plurality of first base region, adjacent source regions in said adjacent pair of first base region and adjacent first main electrodes on said adjacent pair of first base region are connected respectively to each other.

14. The insulated gate thyristor according to claim 13, wherein a first surface portion of one of said adjacent source regions, said first surface portion facing opposite to one of said pairing second base regions, is covered with said second insulation film, and said first main electrode contacts with a second surface portion of said one of said adjacent source regions, said second surface portion facing opposite to the other one of said pairing second base regions.

15. The insulated gate thyristor according to claim 1, wherein the contact portion of said first main electrode with said first base region and said source region is shaped with a shape selected from the group consisting of a polygon, circle and ellipsoid.

16. The insulated gate thyristor according to claim 1, further comprising lifetime killers, said lifetime killers being localized.

17. The insulated gate thyristor according to claim 16, further comprising a heavily doped thin layer of said second conductivity type, said heavily doped thin layer being in the surface portion of said emitter layer.

18. A method of manufacturing the insulated gate thyristor of claim 17, the method comprising the step of forming said heavily doped thin layer of said second conductivity type in the surface portion of said emitter layer by helium ion implantation.

19. The insulated gate thyristor according to claim 1, wherein at least a portion of said source region below the edge of said gate electrode is divided into a plurality of regions.

20. The insulated gate thyristor according to claim 1, wherein said gate electrode is wider between two of said source regions than between said source region and said emitter region.

21. The insulated gate thyristor according to claim 1, further comprising an auxiliary region of said first conductivity type in the surface portion of said base layer beneath said first insulation film, said auxiliary region being doped more heavily than said base layer.

22. The insulated gate thyristor according to claim 1, wherein said second base region is diffused more deeply than said first base region, and said emitter region is diffused more deeply than said source region.

23. The insulated gate thyristor according to claim 1, further comprising a buffer layer of said first conductivity type, said buffer layer being between said base layer and said emitter layer and doped more heavily than said base layer.

24. An insulated gate thyristor comprising:

a highly resistive base layer of a first conductivity type;

a first base region of a second conductivity type, said first base region being selectively formed in the surface portion on a first side of said base layer;

a second base region of said second conductivity type, said second base region being selectively formed in the surface portion on said first side of said base layer;

said first and second base regions being spaced from each other;

a source region of said first conductivity type, said source region being selectively formed in the surface portion of said first base region;

an emitter region of said first conductivity type, said emitter region being in the surface portion of said second base region;

a trench between said first and second base regions, said trench being dug more deeply than said first and second base regions;

a first insulation film covering the inner surface of said trench;

a gate electrode in said trench with said first insulation film interposed between said gate electrode and said trench;

a first main electrode commonly contacting with an extended portion of said first base region and said source region, said extended portion being extended beside said source region;

an emitter layer of said second conductivity type, said emitter layer being on a second side of said base layer;

a second main electrode contacting with said emitter layer; and a second insulation film covering the entire surface of said second base region;

a resistor on said emitter region, said resistor being connected to said first main electrode.

25. The insulated gate thyristor according to claim 24, wherein said first and second base regions are shaped with stripes facing opposite to each other.

26. The insulated gate thyristor according to claim 24, wherein at least one of said first base region, said second base region, said emitter region and said source region is formed in a shape selected from the group consisting of a polygon, circle and ellipsoid.

27. The insulated gate thyristor according to claim 24, wherein said first base region is around said second base region.

28. The insulated gate thyristor according to claim 24, wherein a plurality of said first base region is around said second base region.

29. The insulated gate thyristor according to claim 28, further comprising base regions of said second conductivity type, wherein said source region of said first conductivity type is not formed.

30. The insulated gate thyristor according to claim 29, wherein said gate electrode is wider on said first base regions, wherein said source region is formed, than on said base regions, wherein said source region is not formed.

31. The insulated gate thyristor according to claim 28, wherein the portion of said source region's surface near to said second base region is covered with said second insulation film, and said first main electrode contacts with the portion of said source region's surface far from said second base region.

32. The insulated gate thyristor according to claim 24, wherein the contact portion of said first main electrode with said first base region and said source region is shaped with a shape selected from the group consisting of a polygon, circle and ellipsoid.

33. The insulated gate thyristor according to claim 24, wherein at least a portion of said source region below the edge of said gate electrode is divided into a plurality of regions.

34. The insulated gate thyristor according to claim 24, wherein said gate electrode is wider between two of said source regions than between said source region and said emitter region.

35. The insulated gate thyristor according to claim 24, further comprising an auxiliary region of said first conductivity type in the surface portion of said base layer beneath said first insulation film, said auxiliary region being doped more heavily than said base layer.

36. The insulated gate thyristor according to claim 24, further comprising lifetime killers, said lifetime killers being localized.

37. The insulated gate thyristor according to claim 36, further comprising a heavily doped thin layer of said second conductivity type, said heavily doped thin layer being in the surface portion of said emitter layer.

38. A method of manufacturing the insulated gate thyristor of claim 37, the method comprising the step of forming said heavily doped thin layer of said second conductivity type in the surface portion of said emitter layer by helium ion implantation.

39. The insulated gate thyristor according to claim 24, wherein said second base region is diffused more deeply than said first base region, and said emitter region is diffused more deeply than said source region.

40. The insulated gate thyristor according to claim 24, further comprising a buffer layer of said first conductivity type, said buffer layer being between said base layer and said emitter layer and doped more heavily than said base layer.

* * * * *